(12) United States Patent
Kim et al.

(10) Patent No.: US 8,101,480 B1
(45) Date of Patent: Jan. 24, 2012

(54) METHODS OF FORMING TRANSISTORS AND CMOS SEMICONDUCTOR DEVICES USING AN SMT TECHNIQUE

(75) Inventors: Seok-Hoon Kim, Hwaseong-si (KR); Chung-Geun Koh, Seoul (KR); Kwan-Yong Lim, Seongnam-si (KR); Hyun-Jung Lee, Suwon-si (KR); Tae-Ouk Kwon, Hwaseong-si (KR); Sang-Bom Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/944,774

(22) Filed: Nov. 12, 2010

(30) Foreign Application Priority Data

Sep. 3, 2010 (KR) .................. 10-2010-0086415

(51) Int. Cl.
*H01L 21/8238* (2006.01)
*H01L 21/02* (2006.01)

(52) U.S. Cl. .................. 438/231; 257/410; 257/190

(58) Field of Classification Search .................. None
See application file for complete search history.

(56) References Cited

U.S. PATENT DOCUMENTS

| | | | |
|---|---|---|---|
| 7,678,636 B2 | 3/2010 | Chuang et al. | |
| 2006/0175671 A1* | 8/2006 | Cao | 257/410 |
| 2007/0105299 A1 | 5/2007 | Fang et al. | |
| 2007/0141775 A1* | 6/2007 | Teo et al. | 438/231 |
| 2009/0298297 A1 | 12/2009 | Kanarsky et al. | |
| 2010/0181599 A1* | 7/2010 | Kim et al. | 257/190 |

* cited by examiner

*Primary Examiner* — Ha Tran T Nguyen
*Assistant Examiner* — Valerie N Brown
(74) *Attorney, Agent, or Firm* — Volentine & Whitt, PLLC

(57) ABSTRACT

A method of forming a transistor induces stress in the channel region using a stress memorization technique (SMT). Impurities are implanted into a substrate adjacent a gate electrode structure to produce an amorphous region adjacent the channel region. The amorphous region is then recrystallized by forming a metal-oxide layer over the amorphous region, and then thermally treating the same. The crystallization creates compressive stress in the amorphous region. As a result, stress is induced in the channel region of the substrate located under the gate electrode structure.

40 Claims, 20 Drawing Sheets

METHODS OF FORMING TRANSISTORS AND CMOS SEMICONDUCTOR DEVICES USING AN SMT TECHNIQUE

CLAIM OF PRIORITY

A claim of priority under 35 U.S.C. §119 is made to Korean Patent Application No. 10-2010-0086415, filed on Sep. 3, 2010, in the Korean Intellectual Property Office (KIPO), the disclosure of which is incorporated herein in its entirety.

BACKGROUND

The inventive concepts relate to the fabricating of transistors and semiconductor devices including the same. In particular, the inventive concepts relate to the fabricating of NMOS transistors and semiconductor devices, such as, for example, CMOS devices, that include NMOS transistors.

A conventional MOSFET (metal-oxide-semiconductor field effect transistor) is fabricated by forming a gate electrode structure at the upper portion of a semiconductor substrate, such as a single-crystalline substrate, and source and drain regions on opposite sides of the gate electrode strucuture. The gate electrode structure generally includes a gate separated from the semiconductor substrate by a thin insulating layer. When a sufficient voltage is applied to the gate electrode, the electric field generated penetrates the insulating layer and creates a channel, through which current can pass, in a region of the semiconductor substate below the gate electrode structure. The channel extends between the source and the drain regions. The source region is so named because it is the source of the charge carriers that flow through the channel. The drain is where the charge carriers leave the channel.

In a conventional NMOS, the source and drain regions are n+ regions of the substrate, and the charge carriers are electrons. It is know to enhance the mobility of the charge carriers, i.e. the electrons, in an NMOS transistor using a technique known as a stress memorization technique (SMT). In one such technique, a silicon oxide ($SiO_2$) buffer layer and a silicon nitride (SiN) tensile stress layer are sequentially formed on the substrate over the gate electrode structure and the source/drain regions. The substrate is then thermally treated which increases the tensile stress in the SiN layer. As a result, the stress in the SiN layer is "memorized" as compressive stress in the source and drain regions. The compressive stress in the source and drain regions, in turn, induces tensile stress in the channel region, and the tensile stress allows for increased mobility of the electrons through the channel.

SUMMARY

According to an aspect of the inventive concepts, a method of forming a semiconductor device is provided which includes forming a gate electrode structure on a substrate, implanting impurities into the substrate to create an amorphous region within the substrate adjacent the gate electrode structure, forming a tensile stress overlay on the amorphous region and the gate electrode structure, wherein the tensile stress overlay includes a metal-oxide layer, and thermally treating the tensile stress overlay and the amorphous region to crystallize the amorphous region.

According to another aspect of the inventive concepts, a method of forming a semiconductor device is provided which includes forming a gate electrode structure on a substrate, implanting impurities into the substrate to create an amorphous region within the substrate adjacent a sidewall of the gate electrode structure, and inducing stress in a channel region of the substrate located below the gate electrode, wherei the inducing stress includes forming a tensile stress overlay comprising a metal-oxide layer on the substrate.

According to still another aspect of the inventive concepts, a method of forming a semiconductor device is provided which includes forming a gate electrode structure of an NMOS transistor on a substrate, where the gate electrode structure includes a patterned insulation layer and a gate electrode disposed on the patterned insulation layer. The method further includes implanting impurities into the substrate to create an amorphous region within the substrate adjacent the gate electrode structure, and forming source/drain regions of the NMOS transistor in the substrate at opposite sides of the first gate electrode structure. The method further includes inducing tensile stress in a region of the substrate, corresponding to a channel of the NMOS transistor. The inducing tensile stress includes forming a tensile stress overlay including a metal-oxide layer on the substrate, and subjecting the substrate bearing the tensile stress overlay to a thermal treatment in which the metal-oxide layer is heated.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION OF EMBODIMENTS

Figure 1:
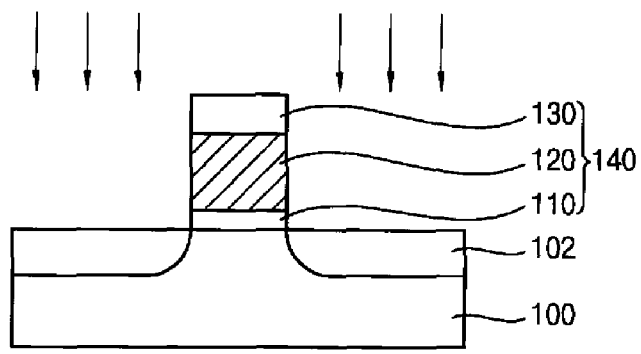
FIGS. 1 to 6 are cross-sectional views of a substrate and together illustrate an embodiment of a method of forming a transistor in accordance with the inventive concepts.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, when like numerals appear in the drawings, such numerals are used to designate like elements.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Furthermore, as used herein, the term "and/or" includes any and all practical combinations of one or more of the associated listed items.

It will be understood that although the terms first, second, third etc. are used herein to describe various elements, regions, layers, etc., these elements, regions, and/or layers are not limited by these terms. These terms are only used to distinguish one element, layer or region from another.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. Likewise, material compositions referred to herein as an oxide include those which contain the specified material and oxygen. Thus, a layer described as being of silicon oxide may be a silicon dioxide layer. The terms "tensile stress" and "compressive stress" in a layer as used in this specification refer to axial stress, i.e., stress acting in the planar direction of the layer as opposed to in the direction of thickness of the layer.

As discussed previously herein, conventional techniques utilize a $SiO_2$ buffer layer and SiN layer during SMT fabrication. The purpose of the $SiO_2$ buffer layer is to prevent the underlying structures from being damaged when the SiN layer is removed by an etchant. However, the $SiO_2$ layer has compressive stress characteristics which detract from the efficacy of the SMT technique.

A method of forming a transistor in accordance with the inventive concepts will now be described with reference to FIGS. 1 to 6.

Referring first to FIG. 1, a gate structure 140 is formed on a semiconductor substrate 100. The substrate 100 may be a silicon substrate, a germanium substrate, a silicon-germanium substrate, a silicon-on-insulator (SOI) substrate, a germanium-on-insulator (GOI) substrate or the like. When the substrate 100 is a silicon substrate, the substrate 100 may be of single-crystalline silicon. The substrate 100 may also have a well region (not shown) including p-type impurities or n-type impurities.

The gate structure 140 can be formed by sequentially forming a gate insulation layer, a gate conductive layer and a gate mask layer on the substrate 100 and conducting photolithography to pattern the gate mask layer, the gate conductive layer and the gate insulation layer. In this case, the gate structure 140 of this example includes a gate insulation layer pattern 110, a gate electrode 120 and a gate mask 130 sequentially stacked on the substrate 100. However, the embodiments are not-limited by the particularities of the gate structure 140.

In examples of this embodiment, the gate insulation layer may be formed of an oxide, such as silicon oxide or of an oxynitride such as silicon oxynitride, by a thermal oxidation process or a chemical vapor deposition (CVD) process. The gate conductive layer may, for example, be formed of doped polysilicon, a metal, a metal nitride and/or a metal silicide. The gate mask layer may, for example, be formed of silicon nitride or silicon oxynitride. Furthermore, the gate conductive layer and the gate mask layer can be formed by a CVD process, a physical vapor deposition (PVD) process, an atomic layer deposition (ALD) process, or the like.

Ions are implanted into the substrate 100 using the gate structure 140 as an ion implantation mask to amorphousize an upper portion of the substrate 100 adjacent to the gate structure 140. In examples of this embodiment, silicon ions or germanium ions are implanted into the substrate 100. The energy level at which the ions are implanted, i.e., the so-called ion implantation energy, for forming the amorphous region may be, for example, preferably 2 KeV to 60 KeV and more preferably, 20 KeV to 60 KeV. As a result, an amorphous ion implantation region 102 is formed in an upper portion of the substrate 100 adjacent to the gate structure 140. In particular, the ion implantation region 102 has portions disposed on opposite sides of the gate structure 140, respectively.

Second impurities may also be implanted into the substrate 100 using the gate structure 140 as an ion implantation mask to form a second impurity region (not shown) at an upper portion of the substrate 100 adjacent to the gate structure 140. In this case, the second impurities may be n-type impurities such as phosphorus (P) or arsenic (As).

Such a second impurity region may instead be formed simultaneously with the amorphous ion implantation region 102. Alternatively, the second impurity region may be formed prior to the amorphous ion implantation region 102. In either case, the second impurity region may be formed within the region over which the amorphous ion implantation region 102 is formed. Alternatively, the second impurity region may be larger than region over which the amorphous ion implantation region 102 is formed and so as to encompass the entire amorphous ion implantation region 102.

Figure 2:
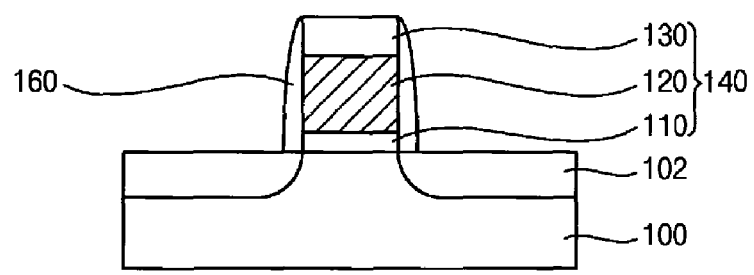

Referring to FIG. 2, in the example of this embodiment, a spacer 160 is formed on the sidewall of the gate structure 140.

The spacer layer may be formed of a nitride such as silicon nitride. The spacer 160 can be formed by forming a spacer layer over the gate mask 130, the gate electrode 120 and the gate insulation layer pattern 110 on the substrate 100, and anisotropically etching the spacer layer.

Figure 3:
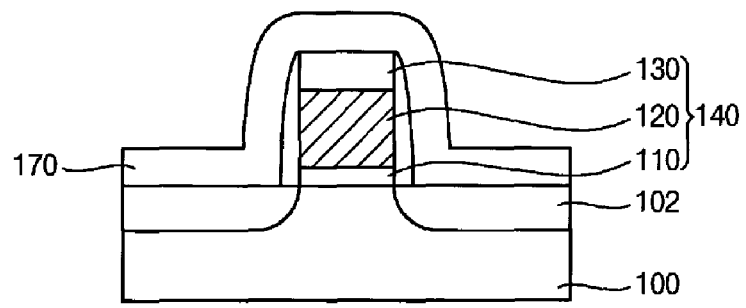

Referring to FIG. 3, a tensile stress overlay is formed on the substrate 100. In the example of this embodiment, the tensile stress overlay consists of a single tensile stress layer 170 formed on the substrate 100 so as to cover the ion implantation region 102. Also in this embodiment, the tensile stress layer 170 is a metal-oxide material layer (herein, "metal-oxide" means an oxide comprising a metal) that has tensile stress (e.g., when thermally treated) and that may be a high-k material. In particular, the tensile layer 170 may be a layer of aluminum oxide, a metal silicate or a metal oxynitride. For example, the tensile stress layer 170 may be a layer of aluminum oxide ($Al_2O_3$), hafnium silicate (HfSiO), zirconium silicate (ZrSiO), lanthanum silicate (LaSiO), hafnium silicon oxynitride (HfSiON) or zirconium silicon oxynitride (ZrSiON). In the example of this embodiment, the tensile stress layer 170 is formed to a thickness of about 10 to about 250 Å. Furthermore, and as shown in the figure, the tensile stress layer 170 may cover the gate structure 140 and the spacer 160, i.e., may be a conformal layer.

Figure 4:
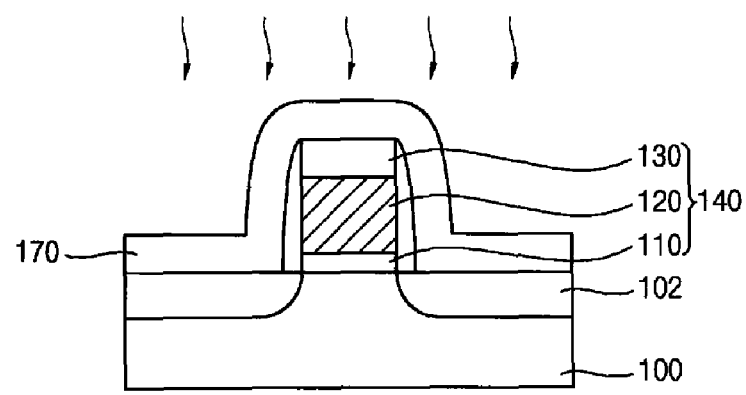

Referring to FIG. 4, the substrate 100 on which the tensile stress layer 170 has been formed is thermally treated (heat treated) to induce stress in the amorphous ion implantation region 102. More specifically, the substrate 100 bearing the tensile stress layer 170 is heat treated in such a way as to increase the tensile stress in the layer 170, and the stress in this resultant tensile stress overlay is imparted to the underlying amorphous ion implantation region 102. As a result, the amorphous ion implantation region 102 recrystallizes, transforming into a crystalline ion implantation region 104 including compressive stress. In this embodiment, the thermal treatment comprises heating the substrate 100 at a temperature lower than the crystallization temperature of the tensile stress layer 170. For example, the thermal treatment exposes the structure to a temperature of less than about 800° C. when the tensile stress layer 170 is a layer of aluminum oxide.

In any case, as a result, the compressive stress in the portions of the crystalline ion implantation region 104 at opposite sides of the gate structure 140 produces tensile stress in the upper portion of the substrate 100 situated under the gate structure 140. That is, the tensile stress overlay induces tensile stress in the channel region of the transistor. Tensile stress in the channel region allows for increased mobility of electrons through the channel region. This translates into improved driving current characteristics and a higher operating speed for the transistor.

Figure 5:
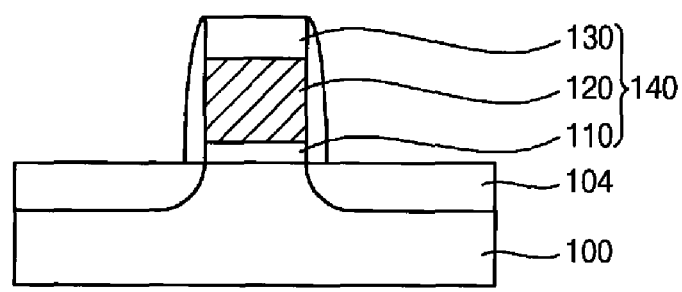

Referring to FIG. 5, the tensile stress layer 170 is then removed. For example, the tensile stress layer 170 can be removed with a hydrofluoric acid (HF) based etching solution. In a specific example of the present embodiment, the tensile stress layer 170 is a layer of aluminum oxide that has been thermally treated at a temperature of about 630° C., and the tensile stress layer 170 is etched away by a dilute hydrofluoric acid (HF) solution of about 0.5% hydrofluoric acid (HF). In this case, the tensile stress layer 170 is removed at a rate (an etch rate) of about 2.3 Å/sec which is similar to the rate at which a layer of silicon oxide would be removed using the same solution. That is, since the thermal treatment was carried out a temperature below the crystallization temperature of aluminum oxide, the tensile stress layer 170 is "etch friendly" after the thermal treatment. Furthermore, silicon nitride (SiN) has a low etch rate with respect to a hydrofluoric acid (HF) based etching solution. Thus, in the case in which the gate mask 130 and the spacer 140 are each of silicon nitride, the gate insulation layer pattern 110 and the gate electrode 120 are prevented from being damaged while the tensile stress layer 170 is being removed.

Figure 6:
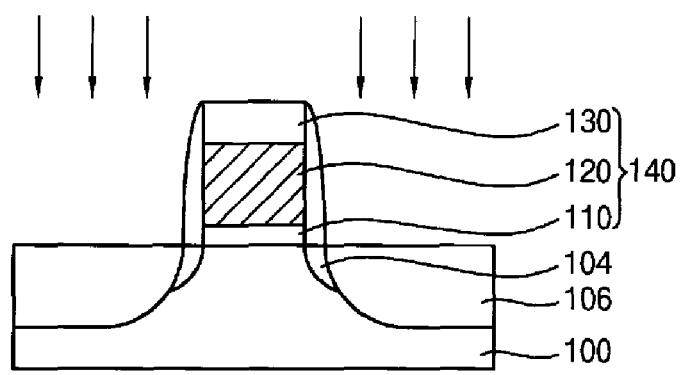

Referring to FIG. 6, first impurities are implanted into the substrate 100 using the gate structure 140 and the spacer 160 as an ion implantation mask to form a first impurity region 106 at an upper portion of the substrate 100 adjacent to the gate structure 140. The first impurities may be n-type impurities such as phosphorus (P) or arsenic (As). In an example of this embodiment, the first impurity region 106 is formed to a depth greater than that of the crystalline ion implantation region 104. The substrate 100 may once again be heat treated after the ion implantation to anneal the source/drain region. Also, in the aforementioned case in which impurities (referred to as second impurities) are also implanted before the spacer 160 is formed, a higher concentration of the first impurities may be implanted than the second impurities. Thus, the resulting impurity region is constituted by a (lightly doped drain) LDD structure. In any case, the impurity region 106 serves as a source/drain region of the transistor.

In the embodiment described above, the tensile stress overlay consists of a single tensile stress layer 170 of a metal-oxide. However, as demonstrated below, the inventive concepts are not limited to a tensile stress overlay of a single metal oxide layer.

Another method of forming a transistor in accordance with the inventive concept will now be described with reference to FIGS. 1, 2, 4-6 and 7.

First, processes similar to those illustrated in and described with reference to FIGS. 1 and 2 are performed.

Next, and with reference again to FIG. 7, a tensile stress overlay is formed on the substrate 100 which includes a first tensile stress layer 180 and a second tensile stress layer 190 sequentially formed on the substrate 100. The first and second tensile stress layers 180 and 190 each include tensile stress. Furthermore, the first and second tensile stress layers 180 and 190 may be formed to cover the gate structure 140 and the spacer 160.

In this embodiment, the first tensile stress layer 180 is a metal-oxide layer. For example, the first tensile stress layer 180 may be a layer of aluminum oxide, a metal silicate or a metal oxynitride. As more specific examples, the first tensile stress layer 180 may be a layer of aluminum oxide ($Al_2O_3$), hafnium silicate (HfSiO), zirconium silicate (ZrSiO), lanthanum silicate (LaSiO), hafnium silicon oxynitride (HfSiON) or zirconium silicon oxynitride (ZrSiON). The second tensile stress layer 190 may, for example, be a layer of silicon nitride.

Preferably, the first tensile stress layer 180 is formed to a thickness less than that of the second tensile stress layer 190. In this embodiment, the first tensile stress layer 180 is formed to a thickness of about 10 to about 120 Å.

Next, the substrate 100 bearing the first and second tensile stress layers 180 and 190 is thermally treated in the manner shown in and described with reference to FIG. 4 to produce a tensile stress overlay whose tensile stress is a combination of those in the first and second tensile stress layers 180 and 190. As a result, the amorphous ion implantation region 102 is transformed into a crystalline ion implantation region 104 whose portions (corresponding to those of the amorphous ion implantation region 102) each include compressive stress. As in the previous embodiment, the compressive stress in the crystalline ion implantation region 104 produces tensile stress in the channel region of the transistor.

Then the first and second tensile stress layers 180 and 190 are then removed, for example, by a wet and/or dry etching process. As a result, a structure such as that shown in previously described FIG. 5 is obtained.

In an example of the wet etching process, the second tensile stress layer 190 is removed with a phosphoric acid ($H_2PO_3$) based etching solution, and the first tensile stress layer 180 is removed with hydrofluoric acid (HF) based etching solution. In this example, the gate mask 130 and the spacer 140 are protected by the first tensile stress layer 180 while the second tensile stress layer 190 is being removed. That is, the first tensile stress layer 180 can serve as an etch stop layer in the process in which the second tensile stress layer 190 is being etched with the phosphoric acid ($H_2PO_3$) based etching solution. Further, in an example in which the first tensile stress layer 180 is a layer of aluminum oxide which has been thermally treated at a temperature of about 630° C., as was described above, the first tensile stress layer 180 can be subsequently etched away at a rate of about 2.3 Å/sec with a dilute solution of about 0.5% hydrofluoric acid (HF).

Next, the process shown in and described with reference to FIG. 6 is performed. That is, first impurities are implanted into the substrate 100 using the gate structure 140 and the spacer 160 as an ion implantation mask to form a first impurity region 106 at an upper portion of the substrate 100 adjacent to the gate structure 140. The resulting impurity region serves as a source/drain region of the transistor.

Figure 7:
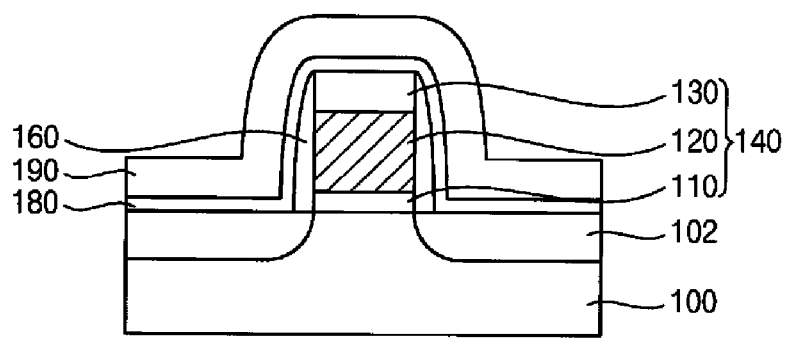
FIG. 7 is a cross-sectional view of a substrate illustrating a process in another embodiment of a method of forming a transistor in accordance with the inventive concepts.
Figure 8A:
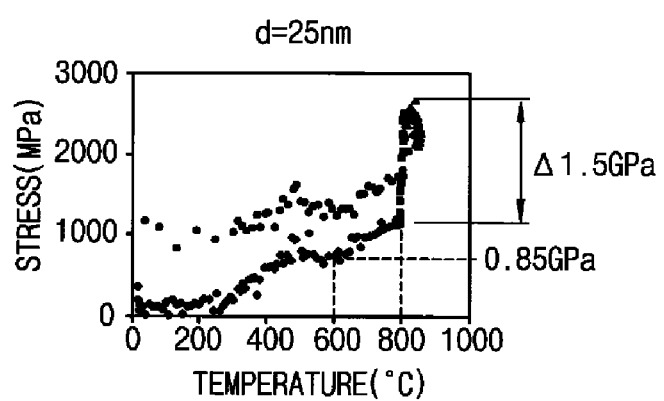
FIGS. 8A, 8B and 8C are graphs showing stress in aluminum oxide layers having thicknesses of 25 nm, 12 nm and 6 nm, respectively, based on temperatures at which the aluminum oxide layers are heat treated.
Figure 8B:
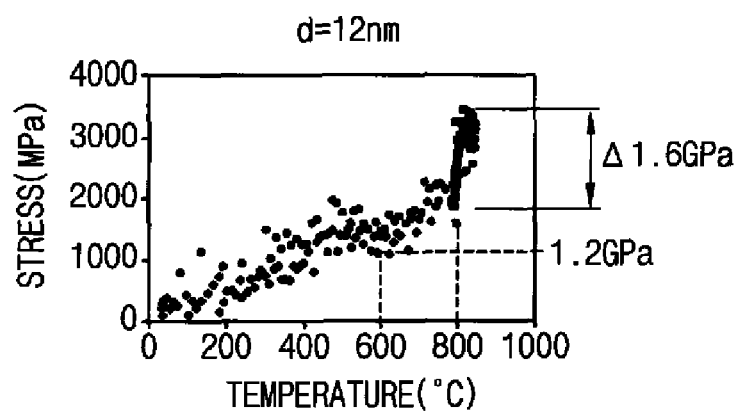
Figure 8C:
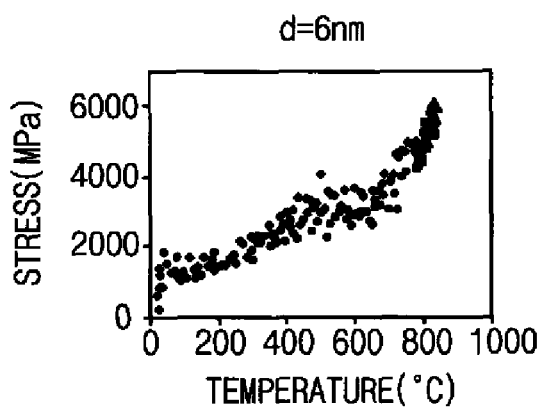

FIGS. 8A, 8B and 8C are graphs showing the increases in tensile stress in aluminum oxide layers having thicknesses d of 25 nm, 12 nm and 6 nm, respectively, upon being thermally treated at various temperatures. These layers thus are exemplary of the tensile stress layers 170 and 180 in the embodiments of FIGS. 1-7.

Referring to the graph of FIG. 8B as an example, when a tensile stress layer of aluminum oxide has a thickness of about 12 nm, a tensile stress of about 1.2 GPa exists in the tensile stress layer after undergoing a heat treatment at a temperature of about 600° C., and a tensile stress of about 3.2 GPa exists in the tensile stress layer after undergoing a heat treatment at a temperature of about 800° C.

The tensile stress induced in the channel region becomes greater as the tensile stress in the tensile stress layer is increased. Moreover, an even greater tensile stress can be induced in the channel region when a second tensile stress layer, as shown in and described with reference to FIG. 7, is added. Thus, a method of manufacturing a semiconductor device according to the inventive concepts can produce a transistor in which the mobility of electrons through the channel region is relatively high. Accordingly, the transistor has correspondingly enhanced driving current characteristics and a correspondingly high operating speed.

Another embodiment of a method of forming a transistor in accordance with the inventive concept will now be described with reference to FIGS. 1, 2, 4-6 and FIG. 9.

First, processes similar to those shown in and with reference to FIGS. 1 to 2 are performed.

Figure 9:
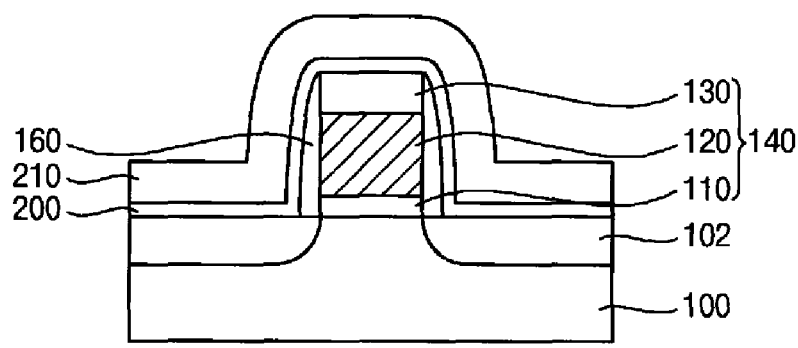
FIG. 9 is a cross-sectional view of a substrate during a process in another embodiment of a method of forming a transistor in accordance with the inventive concepts.

Next, and referring to FIG. 9, an etch stop layer 200 is formed on the substrate 100 including over the gate structure 140 and the spacer 160. The etch stop layer 200 may be formed of silicon oxide, e.g., $SiO_2$. Then, a tensile stress overlay is formed over the etch stop layer 200. In the example of this embodiment, the tensile stress overlay is a tensile stress layer 210 of metal-oxide formed on the etch stop layer 200, preferably to a thickness greater than that of the etch stop layer 210. In this embodiment, the tensile stress layer 210, like that of the previous embodiment, is a layer of aluminum oxide, a metal silicate or a metal oxynitride.

Next, the structure comprising the substrate 100, the etch stop layer 200 and the tensile stress layer 210 may be heat treated at a temperature higher than the crystallization temperature of the tensile stress layer 210. For example, when the tensile stress layer 210 is a layer of aluminum oxide, the structure may be heat treated at a temperature greater than about 800° C. As a result, a relatively high level of stress is produced in the tensile stress layer 210 which in turn produces a correspondingly high level of stress (compressive) in the amorphous ion implantation region 102. Therefore, results and advantages similar but enhanced as compared to those described with reference to FIG. 4 may be obtained.

The tensile stress layer 210 and the etch stop layer 200 are then removed by a dry etch process or a wet etch process to obtain a structure similar to that illustrated in FIG. 5, described above. In an example of the wet etch process, the tensile stress layer 210 is removed with a phosphoric acid ($H_2PO_3$) based etching solution, and the etch stop layer 200 is then removed with a hydrofluoric acid (HF) based etching solution. At this time, the gate mask 130 and the spacer 140 are prevented from being damaged by the etch stop layer 200. That is, as mentioned above, silicon nitride has a low etch rate in a hydrofluoric acid (HF) etching solution. Therefore, the gate mask 130 and the spacer 140 can remain on the substrate 100 without being damaged when the etch stop layer 200 is removed.

Then, processes similar to any of those described with reference to FIG. 6 are performed to complete the transistor.

It is noted here, in connection with the immediately preceeding embodiment, that the phosphoric acid ($H_2PO_3$) based etching solution is utilized to remove the tensile stress layer 200 since the tensile stress layer 210 was previously heated above its crystallization temperature (e.g., in the case of aluminum oxide, above about 800° C.). In this case, the etch stop layer 200 is effective to protect the underlying structure from the phosphoric acid ($H_2PO_3$) based etching solution. However, the embodiment is not specifically limited to heating the tensile stress layer 210 above its crystallization temperature. In an alternative case where the tensile stress layer 210 is heated below its crystallization temperature, it may be possible to remove both the tensile stress layer 210 and the etch stop layer 200 with a hydrofluoric acid (HF) based etching solution.

Next, another embodiment of a method of forming a transistor in accordance with the inventive concept will be described with reference to FIGS. 10 to 13.

Figure 10:
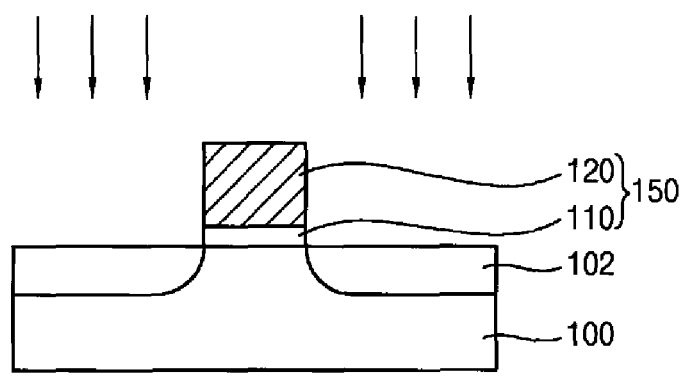
FIGS. 10 to 13 are cross-sectional views of a substrate and together illustrate still another embodiment of a method of forming a transistor in accordance with the inventive concepts.

Referring first to FIG. 10, a gate structure 150 consisting of a gate insulation layer pattern 110 and a gate electrode 120 stacked on the insulation layer pattern 110 is formed on a substrate 100. For example, a gate insulation layer, a gate conductive layer and a gate mask layer (not shown) are sequentially formed on the substrate 100, and a photoresist pattern (not shown) is formed on the gate mask layer. The gate mask layer is then patterned using the photoresist pattern as an etching mask to form a gate mask (not shown). The photoresist pattern is then removed. Subsequently, the gate conductive layer and the gate insulation layer are patterned using the gate mask as an etching mask. The gate mask is removed once the gate conductive layer and the gate insulation layer have been patterned.

Figure 11:
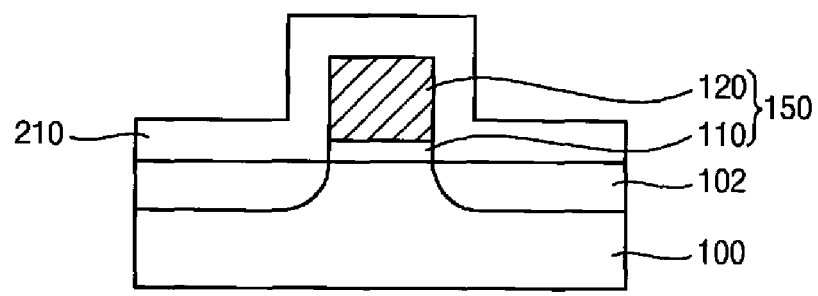

Referring to FIG. 11, a tensile stress overlay is formed on the substrate. In the example of this embodiment, the tensile stress overlay is a tensile stress layer 210 which, like that of previous embodiments, may be a layer of a metal-oxide material, such as an aluminum oxide, a metal silicate or a metal oxynitride.

Then, the substrate 100 bearing the tensile stress layer 210 is thermally treated at a temperature higher than the crystallization temperature of the tensile stress layer 210. As a result, a relatively high level of stress is produced in the tensile stress layer 210 which in turn produces a correspondingly high level of stress (compressive) in the amorphous ion implantation region 102. Therefore, results and advantages similar but enhanced as compared to those described with reference to FIG. 4 are obtained.

Figure 12:
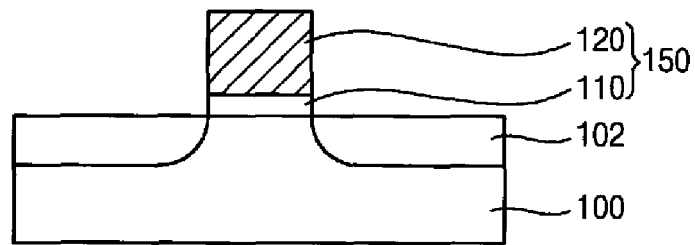

Referring to FIG. 12, the tensile stress layer 210 is then removed by a dry or wet etch process. In the case in which a wet etch process is used, the tensile stress layer 210 is removed with a phosphoric acid ($H_2PO_3$) based etching solution. At this time, the gate structure 150 no longer includes a gate mask, such as a gate mask of silicon nitride, nor is there a spacer of silicon nitride along the sidewall of the gate structure 150. Therefore, no structure is damaged when the fourth tensile stress layer 210 is removed with a phosphoric acid ($H_2PO_3$) based etching solution.

Figure 13:
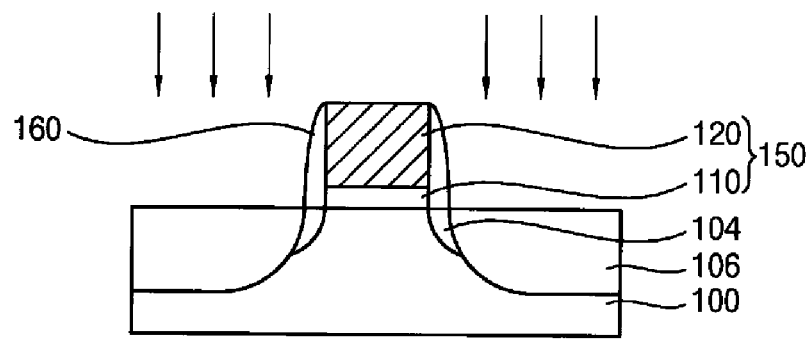

Referring to FIG. 13, a spacer 160 of silicon nitride is then formed on the sidewall of the gate structure 150. Subsequently, processes similar to any of those described with reference to FIG. 6 are performed to form a first impurity region 106, thereby completing the transistor.

Figure 14:
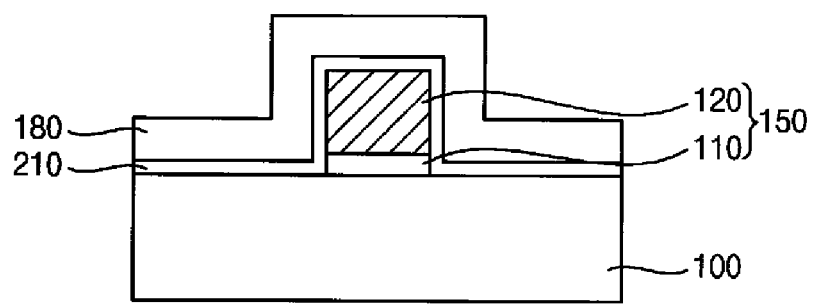
FIG. 14 is a cross-sectional view of a substrate illustrating a process in another embodiment of a method of forming a transistor in accordance with the inventive concepts.

FIG. 14 is used to illustrate another embodiment of a method of forming a transistor in accordance with the inventive concepts. This method is similar to that illustrated with reference to FIGS. 10 to 13, except that a (second) tensile stress layer 180 of silicon nitride is formed on the (first) tensile stress layer 210 of a metal oxide. In an example of this embodiment, both of the tensile stress layers 180 and 210 may be removed using a phosphoric acid ($H_2PO_3$) based etching solution.

Another embodiment of a method of forming a transistor in accordance with the inventive concepts will now be described with reference to FIGS. 15 to 19. As the following description makes clear, this method is similar to that described above with reference to FIGS. 1, 2 and 4-7, except for the process of forming the gate structure.

Figure 15:
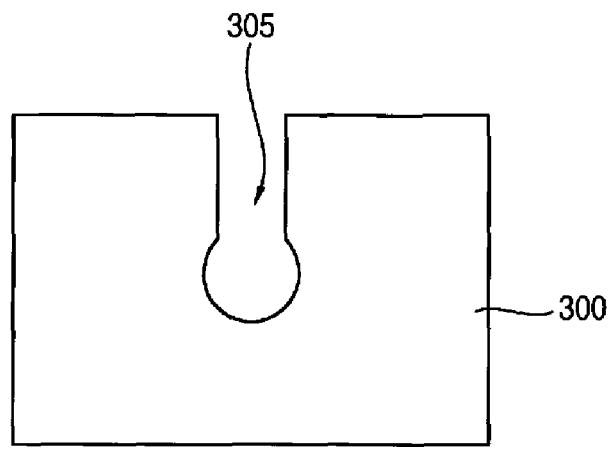
FIGS. 15 to 19 are cross-sectional views of a substrate and together illustrate a method of forming another form of a transistor in accordance with the inventive concepts.

Referring first to FIG. 15, a recess 305 is formed in an upper portion of a substrate 300. For example, a pad oxide layer (not shown) and a hard mask (not shown) are sequentially formed on the substrate 300, and the pad oxide layer and the upper portion of the substrate 300 are etched using the hard mask as an etching mask to form the recess 305. The etching process may be an anisotropic etching process. In an example of this embodiment, an isotropic etching process is performed after the anisotropic etching process so that the recess 305 has a rounded lower portion, as shown in the figure. The hard mask and the pad oxide layer are then removed.

Figure 16:
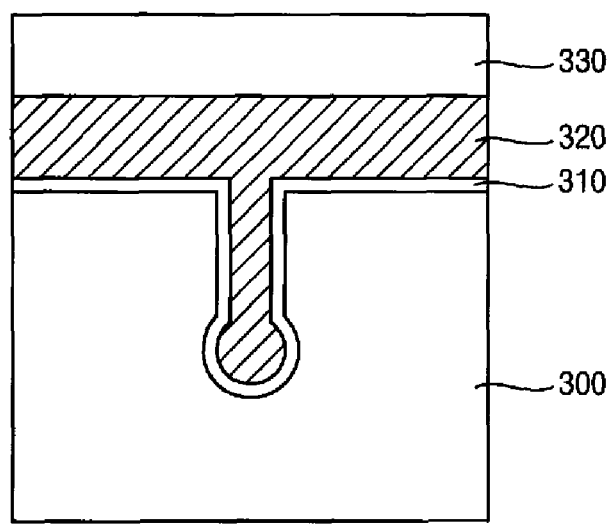

Referring to FIG. 16, a gate insulation layer 310 is then formed on an inner wall of the substrate 300 that delimits the recess 305 and an upper surface of the substrate 300. A gate conductive layer 320 is then formed on the gate conductive layer 320 to such a thickness that the layer 30 fills the remaining portion of the recess 305. A gate mask layer 330 is then formed on the gate conductive layer 320.

Figure 17:
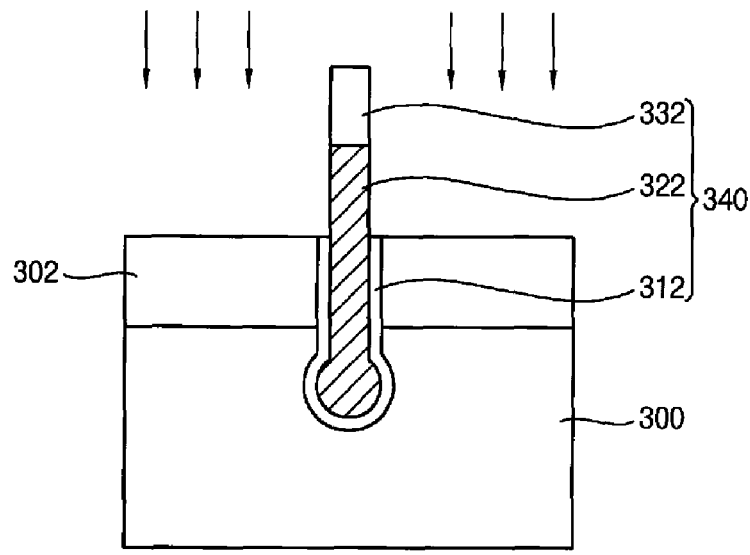

Referring to FIG. 17, the gate mask layer 330, the gate conductive layer 320 and the gate insulation layer 310 are then patterned by a photolithography process to form a recessed gate structure 340. The gate structure 340 thus includes a gate insulation layer pattern 312 extending along the sides of the recess 305, and a gate electrode 322 and a gate mask 332 stacked on the gate insulation layer pattern 312 in the foregoing order. In this way, a relatively long channel is provided despite the fact that the gate electrode 322 is relatively narrow.

Next, ions are implanted into the substrate 300 using the gate structure 340 as an ion implantation mask to form an amorphous ion implantation region 302 at an upper portion of the substrate 300 adjacent to the gate structure 340. In an example of this embodiment, the depth to which the amorphous ion implantation region 302 is formed is less than the depth to which the gate structure 340 extends in the substrate 300.

In an example of this embodiment, second impurities are implanted into the substrate 300 using the gate structure 340 as an ion implantation mask to form a second impurity region (not shown) at an upper portion of the substrate 300 adjacent to the gate structure 340. The second impurities are n-type impurities such as phosphorus (P) or arsenic (As). Such a second impurity region may be formed simultaneously with the amorphous ion implantation region 302. Alternatively, the second impurity region may be formed prior to the amorphous ion implantation region 302. In either case, the second impurity region may be formed within the region over which the amorphous ion implantation region 302 is formed. Alternatively, the second impurity region may be larger than region over which the amorphous ion implantation region 302 is formed and so as to encompass the entire amorphous ion implantation region 302.

Figure 18:
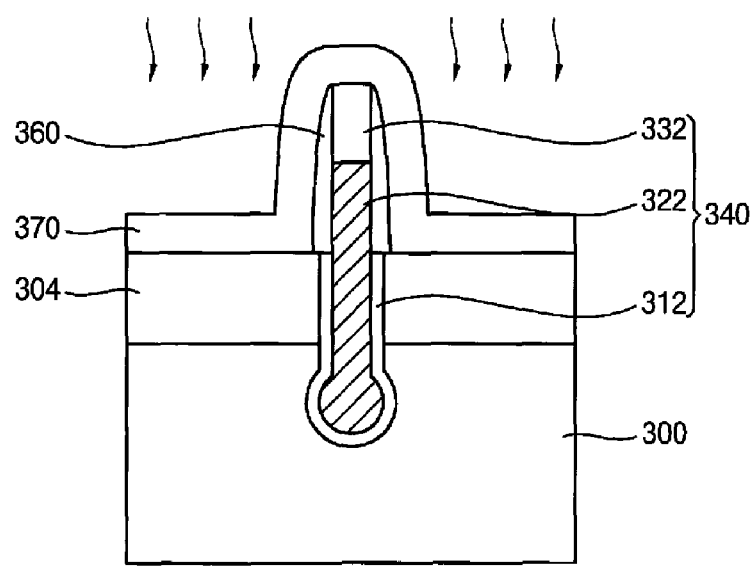

Referring to FIG. 18, a spacer 360 is formed on the sidewall of the gate structure 340. A tensile stress overlay is then formed on the substrate 300 including over the amorphous ion implantation region 302. The tensile stress overlay consists of a tensile stress layer 370 of a metal-oxide, for example a tensile stress layer 370 of aluminum oxide. The substrate 300 is subsequently thermally treated at a temperature lower than the crystallization temperature of the tensile stress layer 370. These processes are otherwise similar to those shown in and described with reference to FIGS. 3 and 4.

As a result, the amorphous ion implantation region 302 recrystallizes, transforming into a crystalline ion implantation region 304 including compressive stress. The compressive stress in the portions of the crystalline ion implantation region 304 at opposite sides of the gate structure 340 produces tensile stress in the upper portion of the substrate 100 disposed alongside that portion of the recess 305 located beneath the crystalline ion implantation region 304 and occupied by a bottom portion of the gate structure 340. That is, tensile stress is induced in the channel region of the transistor. As mentioned above, tensile stress in the channel region allows for increased mobility of electrons of the channel region and hence, improved driving current characteristics and a higher operating speed for the transistor.

Figure 19:
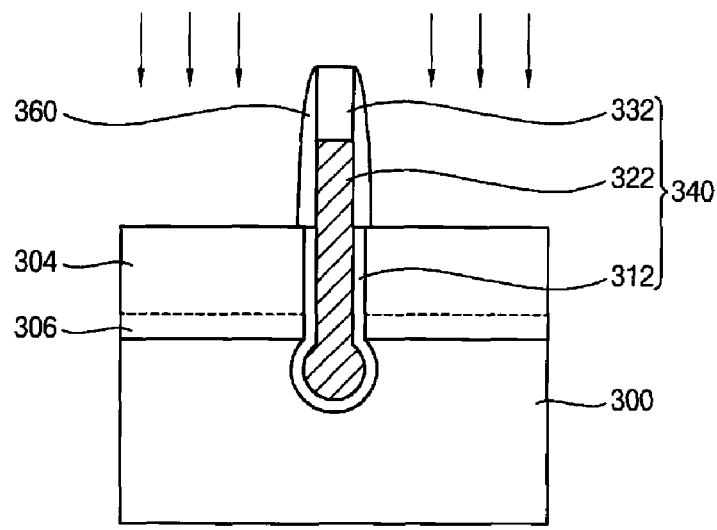

Referring to FIG. 19, the tensile stress layer 370 is removed. In this respect, the tensile stress layer 370 can be removed with a hydrofluoric acid (HF) based etching solution similarly to the process described above with reference to FIG. 5. Furthermore, first impurities are implanted into the substrate 300 using the gate structure 340 and the spacer 360 as an ion implantation mask to form a first impurity region 306 at an upper portion of the substrate 300 adjacent to the gate structure 340. In an example of this embodiment, the first impurity region 306 is formed to a depth greater than that of the crystalline ion implantation region 304 and so as to encompass the crystalline ion implantation region 304. The substrate 300 may be heat treated after the first impurities are implanted.

Figure 20:
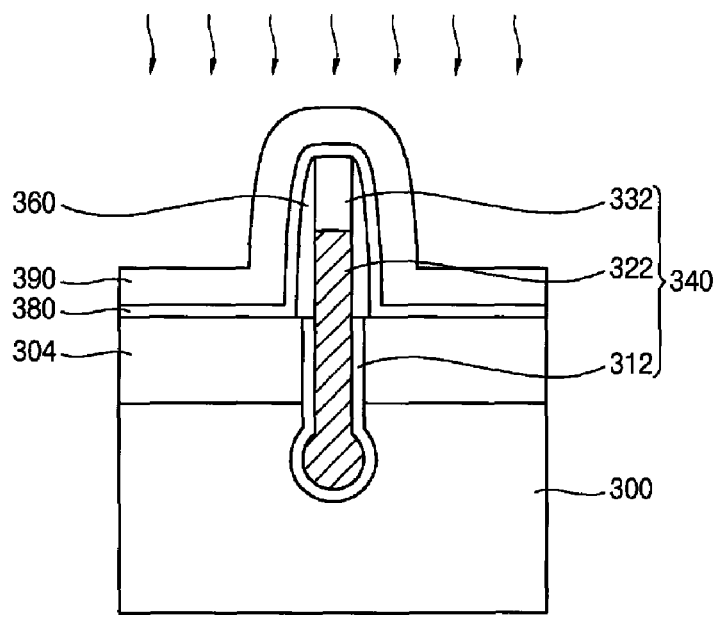
FIG. 20 is a cross-sectional view of a substrate illustrating a process in another embodiment of a method of forming a transistor in accordance with the inventive concepts.
Figure 21:
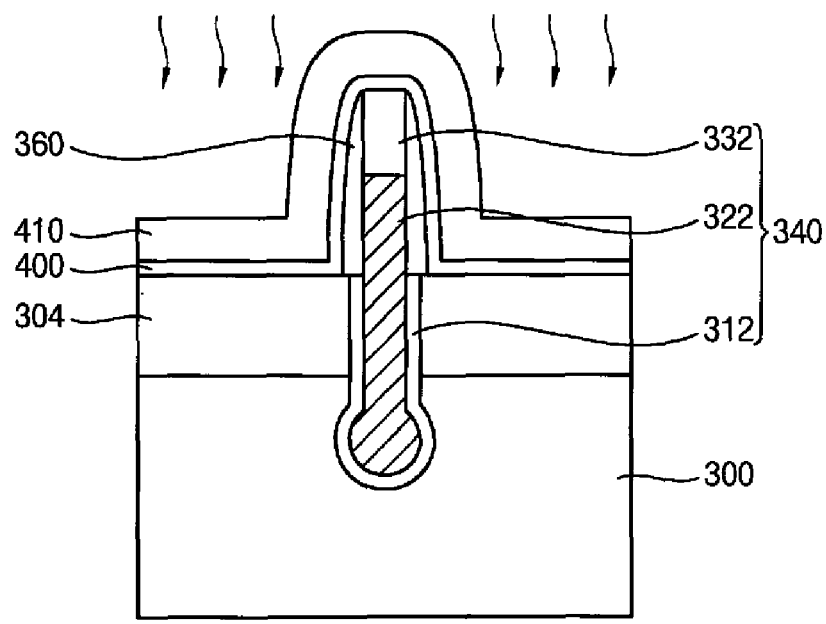
FIG. 21 is likewise a cross-sectional view of a substrate illustrating a process in another embodiment of a method of forming a transistor in accordance with the inventive concepts.

FIGS. 20 and 21 are used to illustrate other embodiments of a method of forming a transistor in accordance with the inventive concept.

In the method of FIG. 20, the tensile stress overlay that is formed on the substrate 300 comprises a first tensile stress layer 380, and a second tensile stress layer 390 sequentially formed on the first tensile stress layer 380. The tensile stress overlay may also cover the recessed gate structure 340 and the spacer 360. The substrate 300 bearing the first and second tensile stress layers 370 and 380 thereon are then heat treated such that the amorphous ion implantation region 302 is recrystallized, transforming the amorphous ion implantation region 302 into a crystalline ion implantation region 304 having compressive stress. These processes are similar to those described in connection with FIGS. 4 and 7 and impart similar advantages to this embodiment.

Then the first tensile stress layer 370 and the second tensile stress layer 380 are removed. For example, the second tensile stress layer 380 is removed with a phosphoric acid ($H_2PO_3$) based etching solution, and the first tensile stress layer 370 is removed with a hydrofluoric acid (HF) based etching solution. Furthermore, first impurities are implanted into the substrate 300 using the gate structure 340 and the spacer 360 as an ion implantation mask to form a first impurity region 306 at an upper portion of the substrate 300 adjacent to the gate structure 340. The substrate 300 may also be heat treated after the first impurities are implanted. These processes are represented by FIG. 19.

The method illustrated using FIG. 21 employs processes similar to those shown in and described with reference to FIG. 9. That is, after processes similar to those shown in and described with reference to FIGS. 16 and 17 are carried out, an etch stop layer 400 of silicon oxide and a tensile stress layer 410 of aluminum oxide are sequentially formed on the substrate 300, and the substrate 300 bearing the etch stop layer 400 and the tensile stress layer 410 is thermally treated at a temperature higher than the crystallization temperature of the tensile stress layer 410.

The tensile stress layer 410 and the etch stop layer 400 are then removed by a dry etch process or a wet etch process. In an example of the wet etch process, the tensile stress layer 210 is removed with a phosphoric acid ($H_2PO_3$) based etching solution, and the etch stop layer 400 is then removed with a hydrofluoric acid (HF) based etching solution. At this time, for the reasons explained above, the gate mask 332 and the spacer 360 are prevented from being damaged by the etch stop layer 400. Then, first impurities are implanted into the substrate 300 using the gate structure 340 and the spacer 360 as an ion implantation mask to form a first impurity region 306 at an upper portion of the substrate 300 adjacent to the gate structure 340, and the substrate 300 may also be heat treated after the first impurities are implanted as shown in and described with reference to FIG. 19.

It should also be noted that other embodiments according to the inventive concept may combine features described above with reference to FIGS. 10 to 14 with those described with reference to FIGS. 16 and 17. In these embodiments, a recessed gate structure 340 and an amorphous ion implantation region 302 are formed at an upper portion of a substrate 300 as shown in FIGS. 16 and 17, the gate mask 332 is removed, a tensile stress overlay comprising a metal oxide is formed on the substrate 300 similarly to the processes shown in described with reference to FIG. 11 or FIG. 14, a thermal treatment is carried out to form a crystalline ion implantation region 304, the tensile stress overlay is removed, a spacer 360 is then formed on the recessed gate, and a first impurity region 306 is then formed at an upper portion of the substrate 300 adjacent to the recessed gate.

Figure 22:
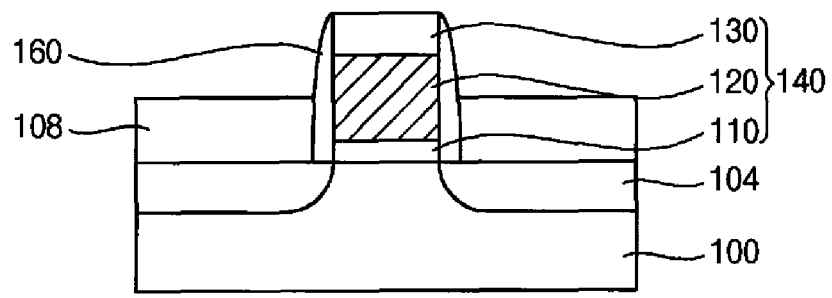
FIGS. 22 to 23 are cross-sectional views of a substrate and illustrate processes, respectively, in a method of forming another form of transistor in accordance with the inventive concepts.
Figure 23:
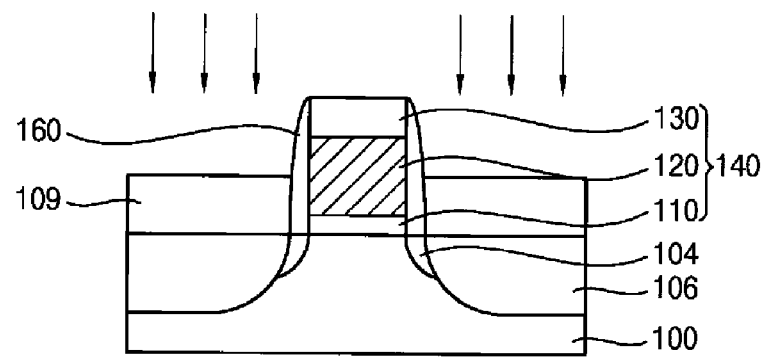

FIGS. 22 to 23 illustrate processes in another embodiment of a method of forming a transistor in accordance with the inventive concept.

In these methods, first, processes similar to those shown in and described with reference to FIGS. 1 to 5 are performed. Alternatively, processes similar to those shown in and described with reference to FIGS. 1, 2, 4, 5 and 7 are performed.

Referring to FIG. 22, a selective epitaxial growth (SEG) process is performed after the tensile stress overlay has been removed from the substrate 100 to form an epitaxial layer 108. The epitaxial layer 108 may be formed using that part of the upper portion of the substrate 100 which is not covered by the gate structure 140 and the spacer 160 as a seed layer.

The SEG process may be carried out using a CVD process such as a reduced pressure chemical vapor deposition (RPCVD) process, a low pressure chemical vapor deposition (LPCVD) process, an ultra high vacuum chemical vapor deposition (UHVCVD) process, an organic metal chemical vapor deposition (MOCVD) process, or the like. In an example of the present embodiment, the SEG process is a CVD process carried out on the substrate 100 at a temperature of about 700 to about 900° C., under a pressure of about 10 to about 50 Torr, and using dichlorosilane ($SiH_2Cl_2$) as a source gas. As a result, a crystalline silicon layer is formed as the epitaxial layer 108. Using these techniques, the epitaxial layer 108 may be formed to a thickness of about 100 to about 500 Å.

Referring to FIG. 23, first impurities are implanted into the epitaxial layer 108 and the substrate 100 using the gate structure 140 and the spacer 160 as an ion implantation mask. The first impurities may be n-type impurities such as phosphorus (P) or arsenic (As). Thus, a first impurity region 106 is formed at an upper portion of the substrate 100 adjacent to the gate structure 140. In this embodiment, the first impurity region 106 is formed to a depth in the substrate 100 greater than the depth to which the crystalline ion implantation region 104 was formed. In addition, the epitaxial layer 108 doped with the first impurities forms an elevated source/drain (ESD) layer 109. The EDS layer 109 and the first impurity region 106 serve as a source/drain region of the transistor. The substrate 100 may be heat treated after the first impurities have been implanted therein.

A method of forming a complementary metal oxide semiconductor (CMOS) device in accordance with the inventive concept will now be described with reference to FIGS. 24 to 28 illustrate. As will be clear from the figures and the description that follows, this method employs processes similar to those shown in and described with reference to FIGS. 1 to 6.

Figure 24:
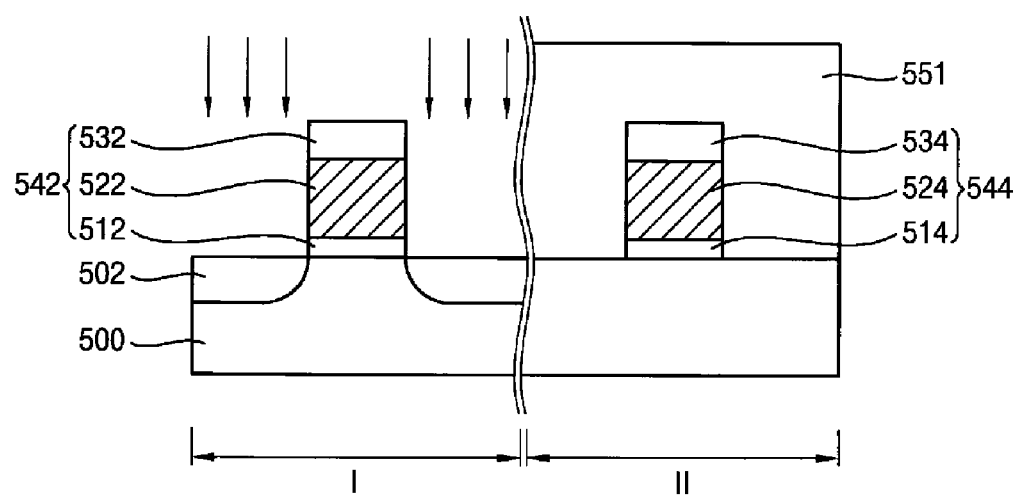
FIGS. 24 to 28 are cross-sectional views of a substrate and together illustrate a method of forming a CMOS device in accordance with the inventive concepts.

Referring to FIG. 24, a first gate structure 542 and a second gate structure 544 are formed on a substrate 500 in a first region I and a second region II, respectively, of the device. In an example of this embodiment, the substrate 500 is a single-crystalline silicon substrate, and the first region I is an NMOS region (the region where an NMOS transistor is formed) and the second region II is a PMOS region (the region where an NMOS transistor is formed).

The first and second gate structures 542 and 544 can be formed by sequentially forming a gate insulation layer, a gate conductive layer and a gate mask layer on the substrate 500 and by patterning the gate mask layer, the gate conductive layer and the gate insulation layer using photolithography. Thus, the first gate structure 542 may include a first gate insulation layer pattern 512, a first gate electrode 522 and a first gate mask 532 stacked in the foregoing order on the substrate 500 in the first region I, and the second gate structure 544 may include a second gate insulation layer pattern 514, a second gate electrode 524 and a second gate mask 534 stacked in the foregoing order on the substrate 500 in the second region II.

A first mask 551 is then formed on the substrate 500 in the second region II so as to cover the second gate structure 544.

Next, ions are implanted into the substrate 500 in the first region I using the first gate structure 542 and the first mask 551 as an ion implantation mask to form an amorphous ion implantation region 502 at an upper portion of the substrate 500 adjacent to the first gate structure 542.

Second impurities may be implanted into the substrate 500 in the first region I using the first gate structure 542 and the first mask 551 as an ion implantation mask to form a second impurity region (not shown) at an upper portion of the substrate 500 adjacent to the first gate structure 542. In this case, the second impurities are n-type impurities such as phosphorus (P) or arsenic (As).

The first mask 551 is then removed.

Figure 25:
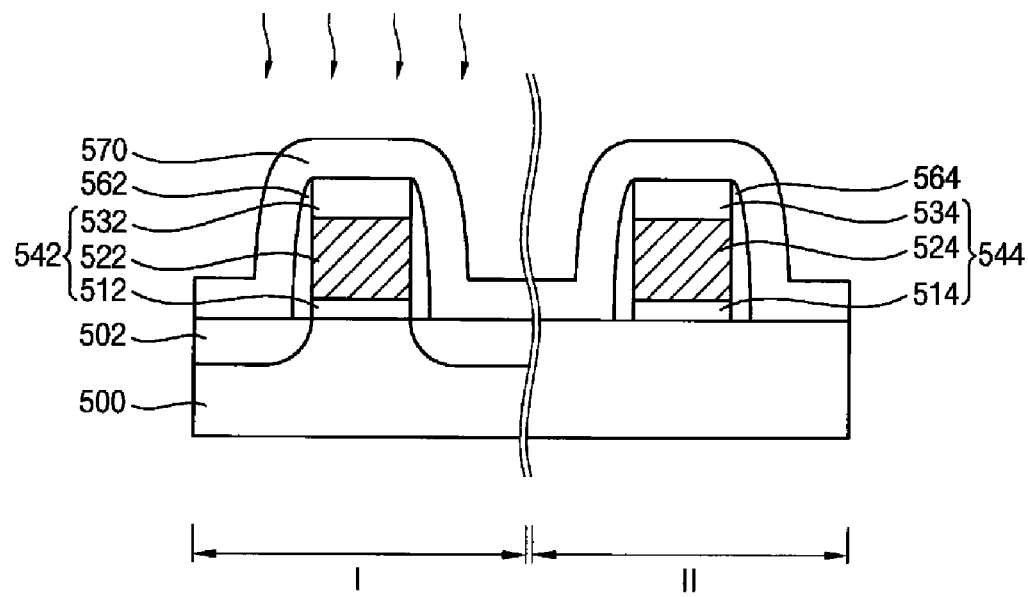

Referring to FIG. 25, a first spacer 562 and a second spacer 564 are then formed on sidewalls of the first and second gate structures 542 and 544, respectively. In this respect, a spacer layer may be formed on the substrate 500 to such a thickness as to cover the first and second gate structures 542 and 544. The spacer layer may be of a nitride such as silicon nitride. Then the spacer layer is anisotropically etched to form the first and second spacers 562 and 564. Next, a tensile stress layer 570 of a metal oxide is formed on the substrate 500. In this embodiment, the tensile stress layer 570 is a layer of aluminum oxide, and the substrate bearing the tensile stress layer 570 is thermally treated at a temperature lower than the crystallization temperature of the tensile stress layer 570. That is, a tensile stress overlay comprising a metal oxide layer is formed on the amorphous ion implantation region 502.

The tensile stress overlay causes the amorphous ion implantation region 502 to recrystallize and thereby transform into a crystalline ion implantation region 504 having compressive stress. In this embodiment, the substrate 500 in the second region II is not particularly stressed by the thermal treatment because in the second region II the substrate 500 is of single-crystalline silicon.

Figure 26:
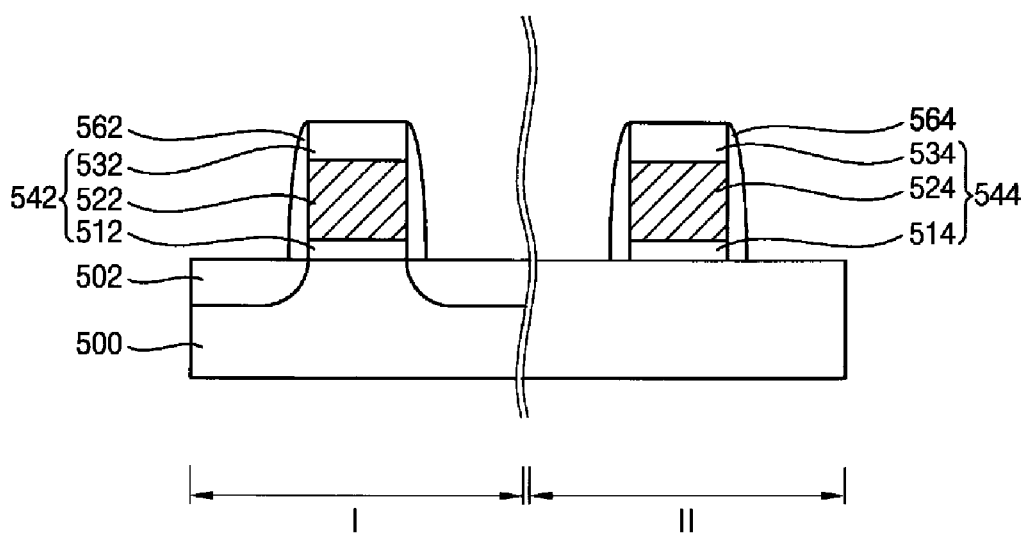

Referring to FIG. 26, the tensile stress layer 570 is then removed. For example, the tensile stress layer 570 can be removed with a hydrofluoric acid (HF) based etching solution similar to the process described above with reference to FIG. 5. Thus, in the case in which the gate masks 532, 534 and the spacer 562, 564 are each of silicon nitride, the gate insulation layer patterns 512, 514 and the gate electrode 522, 524 are prevented from being damaged while the tensile stress layer 570 is being removed.

Figure 27:
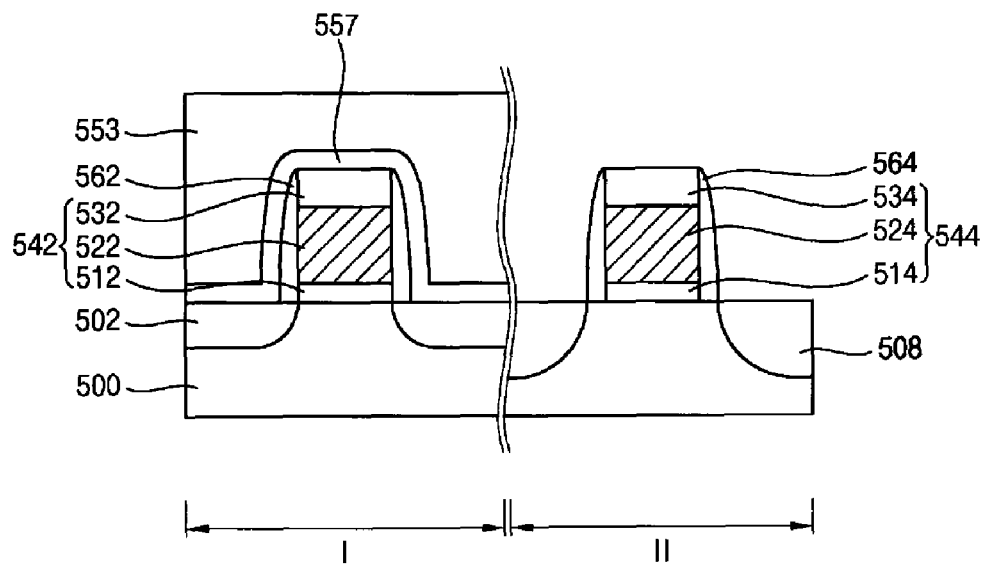

Referring to FIG. 27, a growth prevention layer 557 is formed on the substrate 500 to cover the first and second gate structures 542 and 544 and the first and second spacers 562 and 564. As examples, the growth prevention layer 557 may be a layer of silicon oxide or silicon nitride. A second mask 553 is formed on the substrate 500 so as to cover the growth prevention layer 557 in the first region I. The growth prevention layer 557 in the second region II is removed by an etch process in which the second mask 553 is used as an etching mask. Therefore, the only part of the growth prevention layer 557 that remains on the substrate 500 is the growth prevention layer 557 in the first region I.

Next, an upper portion of the substrate 500 in the second region II is removed using the second mask 553, the second gate structure 544 and the second spacer 564 as an etching mask. That is, a trench is formed in the substrate 500 adjacent to the second gate structure 544. The second mask 553 is removed, and then a stress-inducing layer 508 is formed in the trench. For example, in this embodiment an SEG process is performed using dichlorosilane (SiH$_2$Cl$_2$) or germane (GeH$_4$) as source gas to form a single-crystalline silicon-germanium (SiGe) layer 508 filling the trench. At this time, the growth prevention layer 557 prevents the single-crystalline SiGe layer from forming on the substrate 500 in the first region I.

The single-crystalline SiGe layer 508 has a larger crystal lattice than the single-crystalline silicon of the substrate 500. Thus, the single-crystalline SiGe layer 508 induces compressive stress in the channel of the PMOS transistor, i.e., in the region of the substrate 500 under the second gate structure 544. The compressive stress allows for increased mobility of holes through the channel region.

In an example of this embodiment, a p-type impurity source gas such as diborane (B$_2$H$_4$) is used when the single crystalline SiGe layer is formed. As a result, the single-crystalline SiGe layer 508 is doped with p-type impurities such as boron (B). Thus, in addition to inducing compressive stress in the channel, the SiGe layer 508 forms an impurity region. Alternatively, i.e., in another example of this embodiment, after the single-crystalline SiGe layer 508 has been formed, p-type impurities are implanted into the SiGe layer 508 using the second gate structure 544 and the second spacer 564 as an ion implantation mask. In this case, the resulting impurity region may be formed to a depth in the substrate 500 greater than depth to which the SiGe layer 508 was formed. Alternatively, the impurity region may be formed within the bounds of the SiGe layer 508.

The growth prevention layer 557 can then be removed.

Figure 28:
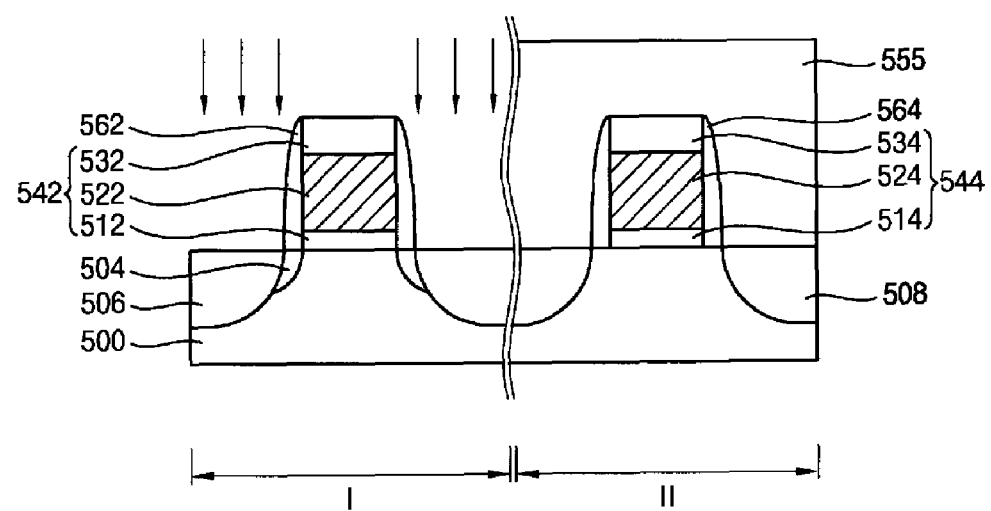

Referring to FIG. 28, a third mask 555 is formed on the substrate 500 in the second region II to cover the second gate structure 544 and the second spacer 564. First impurities are then implanted into the substrate 500 using the first gate structure 542, the first spacer 562 and the third mask 555 as an ion implantation mask to form a first impurity region 506 at an upper portion of the substrate 500 adjacent to the gate structure 542. The first impurities are n-type impurities such as phosphorus (P) or arsenic (As). In an example of this embodiment, the first impurity region 506 is formed to a depth in the substrate 500 greater than to which the crystalline ion implantation region 504 was formed. The substrate 500 may be heat treated following this ion implantation process.

As a result of the above-described processes, a CMOS device is formed. The CMOS device includes an NMOS transistor and a PMOS transistor in the first and second regions I and II, respectively. The channel region of the NMOS transistor has tensile stress, and the channel region of the PMOS transistor has compressive stress. These stresses act to increase the mobility of the carriers through the channel regions, respectively. As a result, a CMOS device produced according to the inventive concept has excellent driving current characteristics.

Figure 29:
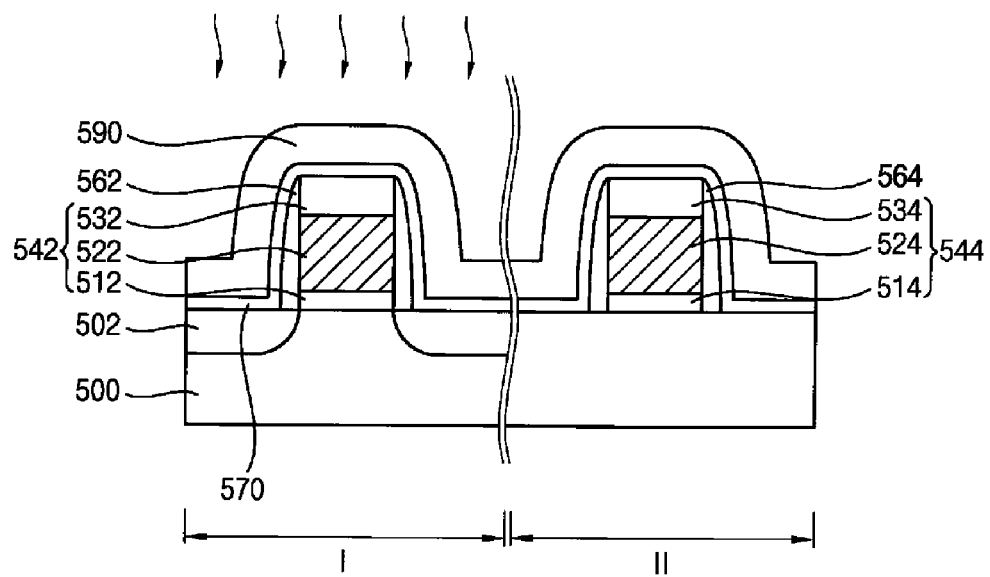
FIG. 29 is a cross-sectional view of a substrate during a process in another embodiment of a method of forming a CMOS device in accordance with the inventive concepts.
Figure 30:
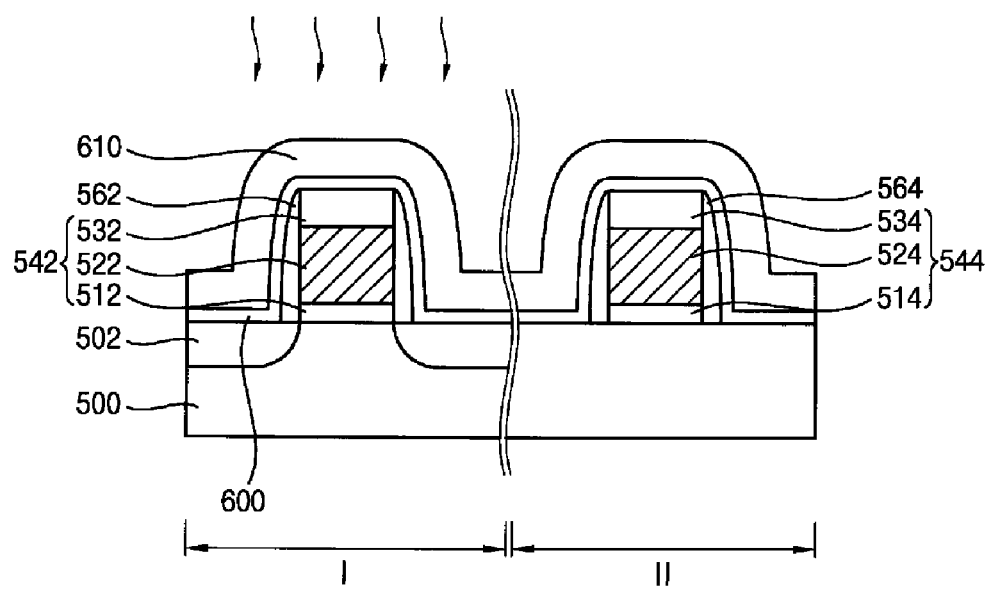
FIG. 30 is a cross-sectional view of a substrate during a process in still another embodiment of a method of forming a CMOS device in accordance with the inventive concepts.

FIGS. 29 and 30 illustrate processes in other embodiments of a method of forming a CMOS device in accordance with the inventive concept. These embodiments are similar to that shown in and described with reference to FIGS. 24 to 28 with the exception of the tensile stress overlay used to induce tensile stress in the channel of the NMOS transistor.

That is, with reference to FIG. 29, a first tensile stress layer 580 and a second tensile stress layer 590 are sequentially formed on the substrate 500 over the first and second gate structures 542 and 544 and the first and second spacers 562 and 564. The first tensile stress layer 580 is a high-k metal oxide selected from the group consisting of aluminum oxide, metal silicates and metal oxynitrides. The second tensile stress layer 590 is a layer of silicon nitride. Subsequently, the substrate 500 bearing the first and second tensile stress layers 580 and 590 are thermally treated at a temperature lower than the crystallization temperature of the first tensile stress layer 580.

The first and second tensile stress layers 580 and 590 are then removed. In this respect, the second tensile stress layer 590 may be removed with a phosphoric acid (H₂PO₃) based etching solution, and the first tensile stress layer 580 may be removed with a hydrofluoric acid (HF) based etching solution.

With reference to FIG. an etch stop layer 600 of silicon oxide and a tensile stress layer 610 of aluminum oxide are formed on the substrate 500, and the substrate 500 bearing the etch stop layer 600 and the tensile stress layer 610 is thermally treated at a temperature higher than the crystallization temperature of the tensile stress layer 610.

The etch stop layer 600 and the tensile stress layer 610 are then removed. For example, the tensile stress layer 610 is removed with a phosphoric acid (H₂PO₃) based etching solution, and the etch stop layer 600 is then removed with a hydrofluoric acid (HF) based etching solution.

Furthermore, it should be clear from the present disclosure, that any of the methods of forming transistors shown in and described with reference to FIGS. 9 to 23 may be applied to form a CMOS device in accordance with the inventive concept.

Another embodiment of a method of manufacturing a semiconductor device in accordance with the inventive concept will be described with reference to FIGS. 31 to 37. In this embodiment, a CMOS device is formed by a method similar to either of those shown in and described with reference to FIGS. 24 to 29. As an example, a method similar to the embodiment shown in and described with reference to FIG. 29 will be used.

Figure 31:
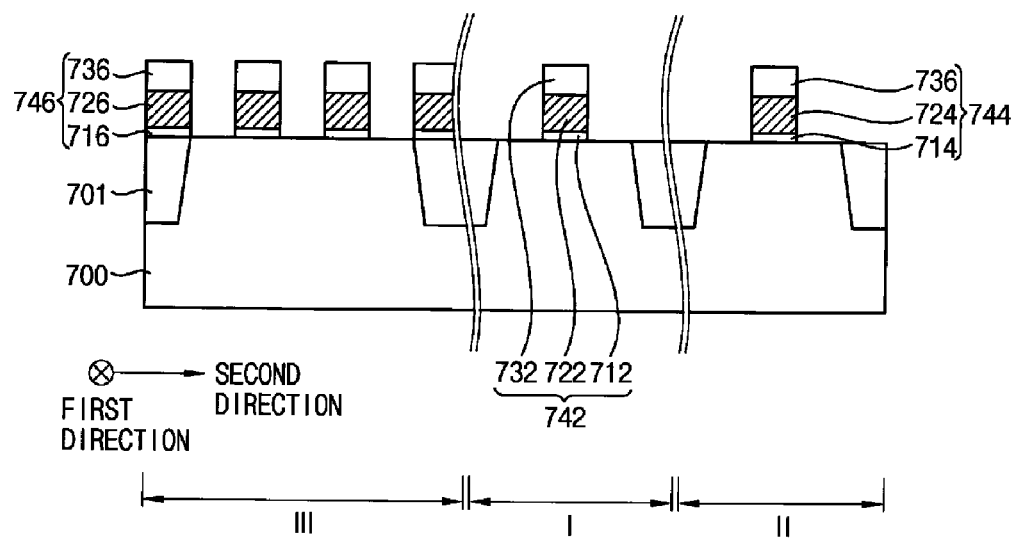
FIGS. 31 to 37 are cross-sectional views of a substrate and together illustrate a method of manufacturing a CMOS device in accordance with the inventive concepts.

Referring to FIG. 31, an isolation layer 701 is formed on a substrate 700, and a first gate structure 742, a second gate structure 744 and a third gate structure 746 are formed on the substrate 700 in a first region I, a second region II and a third region III, respectively, of the device. The first to third gate structures 742, 744 and 746 can be formed by sequentially forming a gate insulation layer, a gate conductive layer and a gate mask layer on the substrate 700 and by patterning the gate mask layer, the gate conductive layer and the gate insulation layer using photolithography. Thus, in this case, the first gate structure 742 includes a first gate insulation layer pattern 712, a first gate electrode 722 and a first gate mask 732 stacked in the foregoing order on the substrate 700 in the first region I, the second gate structure 744 includes a second gate insulation layer pattern 714, a second gate electrode 724 and a second gate mask 734 stacked in the foregoing order on the substrate 700 in the second region II, and the third gate structure 746 includes a third gate insulation layer pattern 714, a third gate electrode 724 and a third gate mask 734 stacked in the foregoing order on the substrate 700 in the third region III.

Each of the gate structures 742, 744 and 746 extends longitudinally in a first direction 1, and the gate structures 742, 744 and 746 are spaced from one another in a second direction 2 perpendicular to the first direction. The third region III is a cell region in which memory cells of the device are formed, and peripheral circuits of the device are formed in the regions I and II. With regard to the latter, the first region I is an NMOS region in which an NMOS of the device is formed, and the second region II is a PMOS region in which a PMOS is formed.

Figure 32:
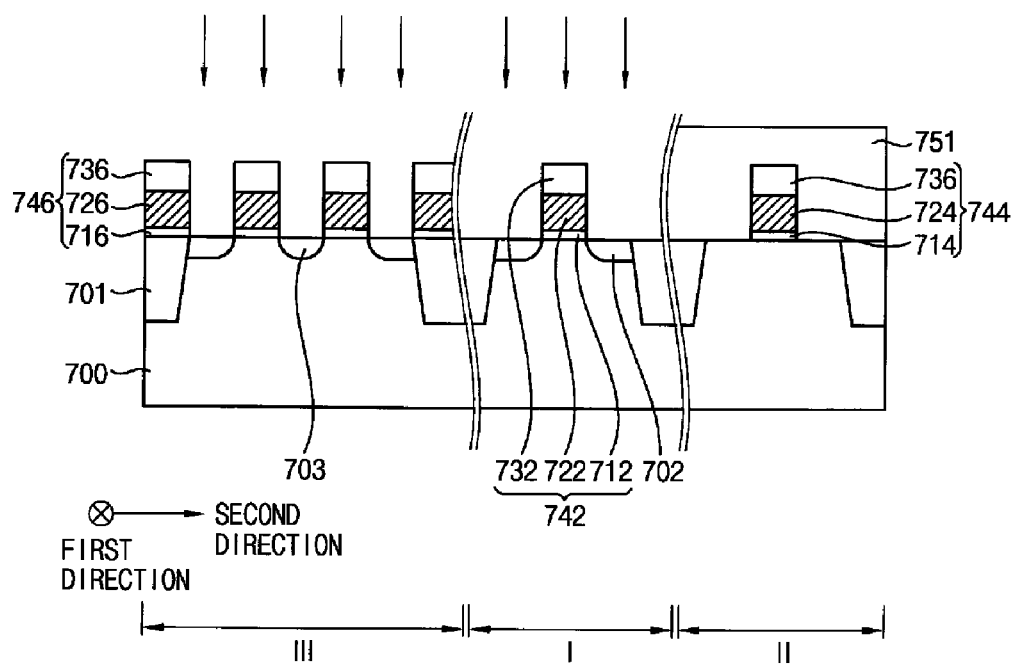

Referring to FIG. 32, a first mask 751 is formed on the substrate 700 in the second region II so as to cover the second gate structure 744. Then, ions are implanted into the substrate 700 in the first and third regions I and III using the first and third gate structures 742 and 746 and the first mask 751 as an ion implantation mask to form a first amorphous ion implantation region 702 and a second amorphous ion implantation region 703 at upper portions of the substrate 700 adjacent to the first and third gate structures 742 and 746, respectively.

In an example of this embodiment, second impurities are implanted into the substrate 700 in the first and third regions I and III using the first and third gate structures 742 and 746 and the first mask 751 as an ion implantation mask to form a second impurity region (not shown) and a fifth impurity region (not shown) at upper portions of the substrate 700 adjacent to the first and third gate structures 742 and 746, respectively. (The forming of first, third and fourth impurity regions will be described below). The second impurities are n-type impurities such as phosphorus (P) or arsenic (As).

The first mask 751 is then removed.

Figure 33:
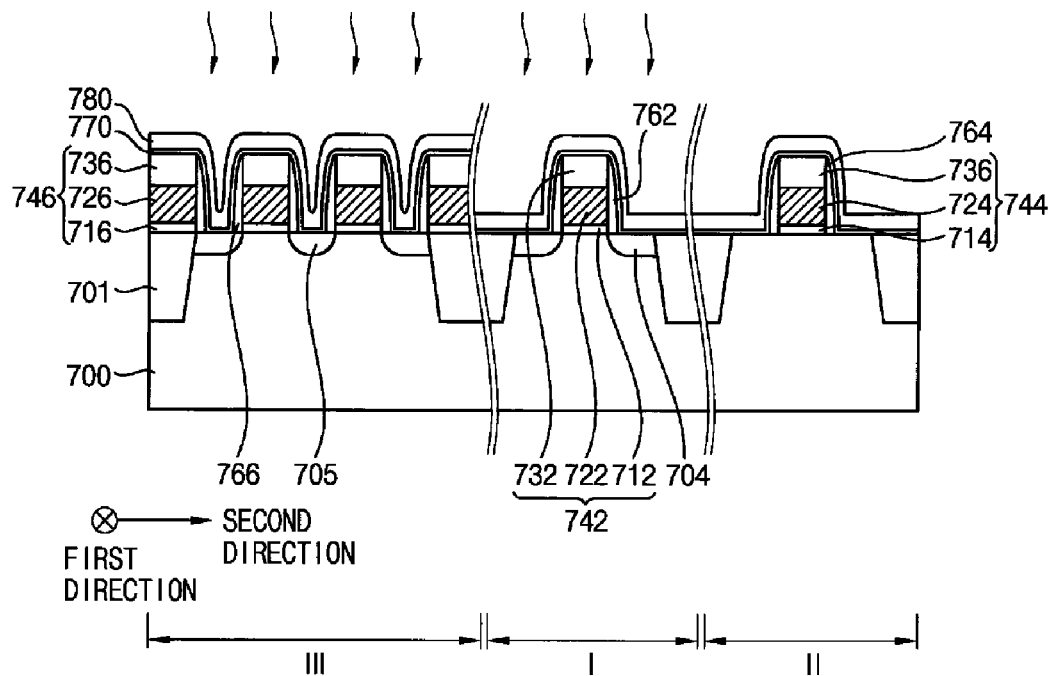

Referring to FIG. 33, a first spacer 762, a second spacer 764 and a third spacer 766 are formed on sidewalls of the first, second and third gate structures 742, 744 and 746, respectively. In this respect, a spacer layer is formed on the substrate 700 to such a thickness as to cover the first to third gate structures 742, 744 and 746. The spacer layer may be a nitride layer such as a layer of silicon nitride. The spacer layer is then anisotropically etched to form the first, second and third spacers 762, 764 and 766.

A tensile stress overlay comprising a high-k metal oxide is then formed on the substrate 700 over the first amorphous ion implantation region 702 and the second amorphous ion implantation region 703.

For example, a first tensile stress layer 780 and a second tensile stress layer 790 are sequentially formed on the substrate 700. The first and second tensile stress layers 780 and 790 may cover the first to third gate structures 742, 744 and 746 and the first to third spacers 762, 764 and 766. In this embodiment, the first tensile stress layer 770 is a metal oxide layer selected from the group consisting of aluminum oxide, metal silicates and metal oxynitrides. The second tensile stress layer 790 is a layer of silicon nitride. The substrate 700 bearing the first and second tensile stress layers 780 and 790 is then thermally treated at a temperature lower than the crystallization temperature of the first tensile stress layer 790. As a result, the first and second amorphous ion implantation regions 702 and 703 are recrystallized to form first and second crystalline ion implantation regions 704 and 705, respectively, each of which has compressive stress.

Figure 34:
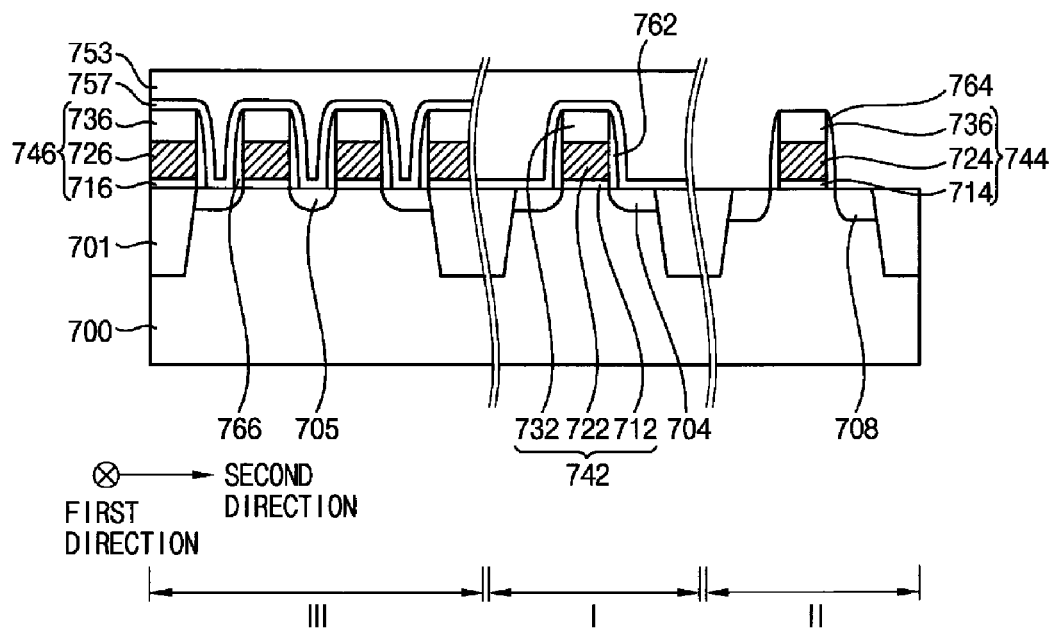

Referring to FIG. 34, the first and second tensile stress layers 770 and 780 are subsequently removed. In this embodiment, the second tensile stress layer 780 is removed with a phosphoric acid (H₂PO₃) based etching solution, and the first tensile stress layer 770 is removed with a hydrofluoric acid (HF) based etching solution.

Next, a growth prevention layer 757 is formed on the substrate 700 including over the first to third gate structures 742, 744 and 746 and the first to third spacers 762, 764 and 766. In examples of this embodiment, the growth prevention layer 757 is formed of silicon oxide or silicon nitride. A second mask 753 covering the growth prevention layer 757 in the first and third regions I and III is then formed on the substrate 700. The growth prevention layer 757 is then etched using the second mask 753 as an etching mask. Accordingly, the only part of the growth prevention layer 757 remaining on the substrate 700 is that part of the growth prevention layer 757 in the first and third regions I and III.

An upper portion of the substrate 700 in the second region II is then removed using the second mask 753, the second gate structure 744 and the second spacer 764 as an etching mask. Thus, a trench (not shown) is formed at the upper portion of the substrate 700 adjacent to the second gate structure 744. Then the second mask 753 is removed.

Subsequently, a stress-inducing layer 708 is formed in the trench. In an example of this embodiment, an SEG process is performed using dichlorosilane ($SiH_2Cl_2$) and germane ($GeH_4$) as source gas to form a single-crystalline silicon-germanium (SiGe) layer that fills the trench. Also, a p-type impurity source gas such as diborane ($B_2H_4$) may be used to dope the single-crystalline SiGe layer with p-type impurities when the single-crystalline silicon-germanium (SiGe) layer is formed. Thus, the fifth stress layer 708 forms a third impurity region in the substrate 700.

Next, the growth prevention layer 757 is removed.

Figure 35:
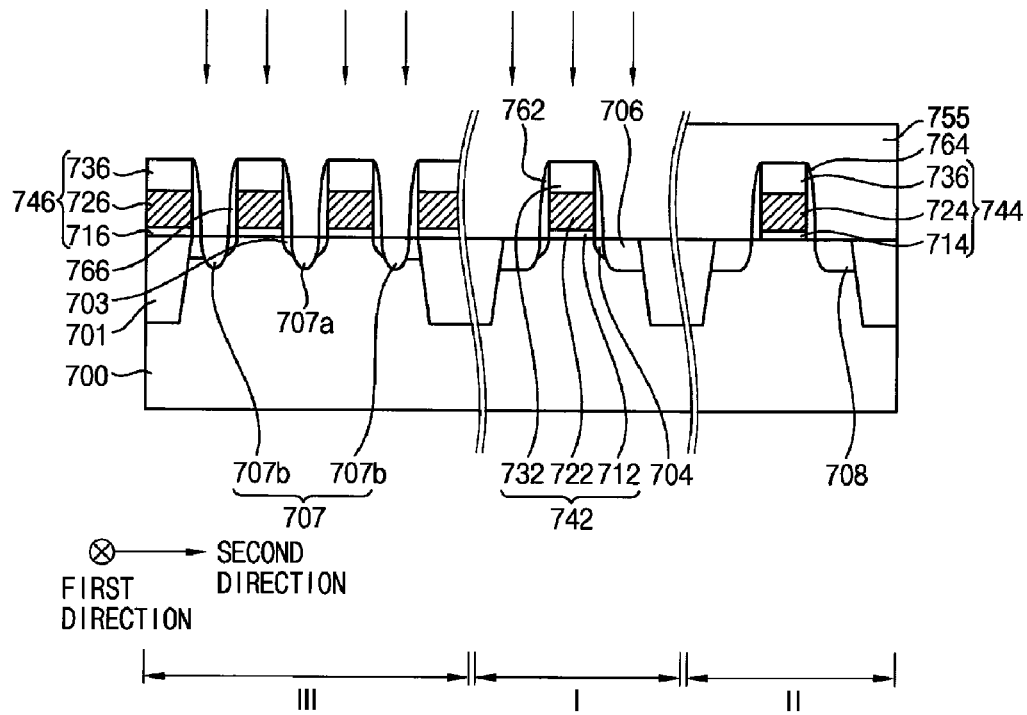

Referring to FIG. 35, a third mask 755 is formed on the substrate 700 in the second region II so as to cover the second gate structure 744 and the second spacer 764. First impurities are implanted into the substrate 700 using the first and third gate structures 742 and 746, the first and third spacers 762 and 766 and the third mask 755 as an ion implantation mask. The first impurities are n-type impurities such as phosphorus (P) or arsenic (As). As a result, first and fourth impurity regions 706 and 707 are formed in upper portions of the substrate 700 adjacent to the first and third gate structure 742 and 746, respectively. The substrate 700 may be heat treated after the ion implantation process. As shown in the figure, the fourth impurity region 707 includes a first source/drain region 707a and a second source/drain region 707b.

The third mask 755 may be removed.

Figure 36:
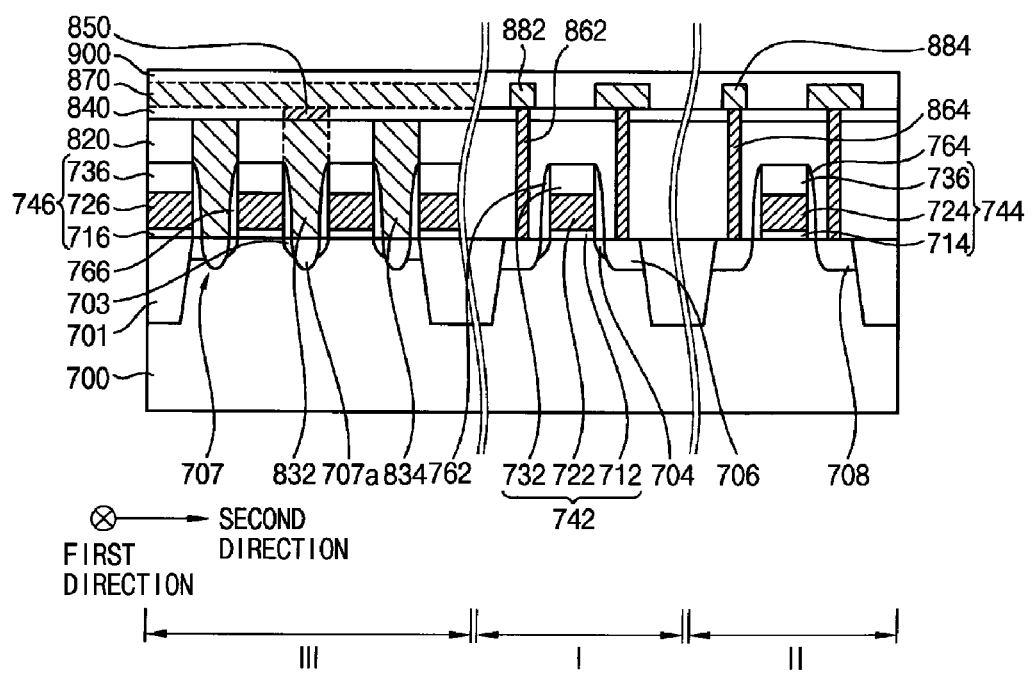

Referring to FIG. 36, a first insulating interlayer 820 is formed on the substrate 700 to cover the gate structures 742, 744 and 746 and the spacers 762, 764 and 766. The first insulating interlayer 820 can be formed of an oxide such as borophosphosilicate glass (BPSG), undoped silicate glass (USG), silicon on glass (SOG), or the like.

Next, first and second conductive plugs 832 and 834 are formed in first insulating interlayer 820 as electrically connected to the first and second source/drain regions 707a and 707b, respectively. In this respect, first openings (not shown) are formed in the first insulating interlayer 820 to expose the first and second source/drain regions 707a and 707b, and a first conductive layer is formed on the first insulating interlayer 820 to such a thickness as to fill the first openings. The first conductive layer may be formed of doped polysilicon, a metal, a metal nitride and/or a metal silicide. Then, the first conductive layer is planarized to such an extent that an upper surface of the first insulating interlayer 820 is exposed and the conductive layer remaining in the openings in the first insulating interlayer 820 constitutes the first and second plugs 832 and 834.

A second insulating interlayer 840 is then formed on the first insulating interlayer 820 and the plugs 832 and 834. Second openings (not shown) are formed in the second insulating interlayer 840 to expose the first plug 832 and the first and third impurity regions 706 and 708, respectively. Next, a second conductive layer is formed on the second insulating interlayer 840 to fill the second openings and cover the first plug 832. The second conductive layer may be formed of doped polysilicon, a metal, a metal nitride and/or a metal silicide. The second conductive layer is then planarized to such an extent that an upper surface of the second insulating interlayer 840 is exposed. The portions of the second conductive layer that remain in the openings form a bit line contact 850 electrically connected to the first plug 832 and third and fourth plugs 862 and 864 electrically connected to the first and third impurity regions 706 and 708, respectively.

Next, a third conductive layer is formed on the second insulating interlayer 840 in contact with the bit line contact 850 and the third and fourth plugs 862 and 864. The third conductive layer may be formed of doped polysilicon, a metal, a metal nitride and/or a metal silicide. This third conductive layer is patterned to form a bit line 870 electrically connected to the bit line contact 850 and first and second wirings 882 and 884 electrically connected to the third and fourth plugs 862 and 864, respectively. In this embodiment, the bit line 870 is formed to extend longitudinally in the second direction.

A third insulating interlayer 900 is then formed on the second insulating interlayer 840 to cover the bit line 870 and the first and second wirings 882 and 884.

Figure 37:
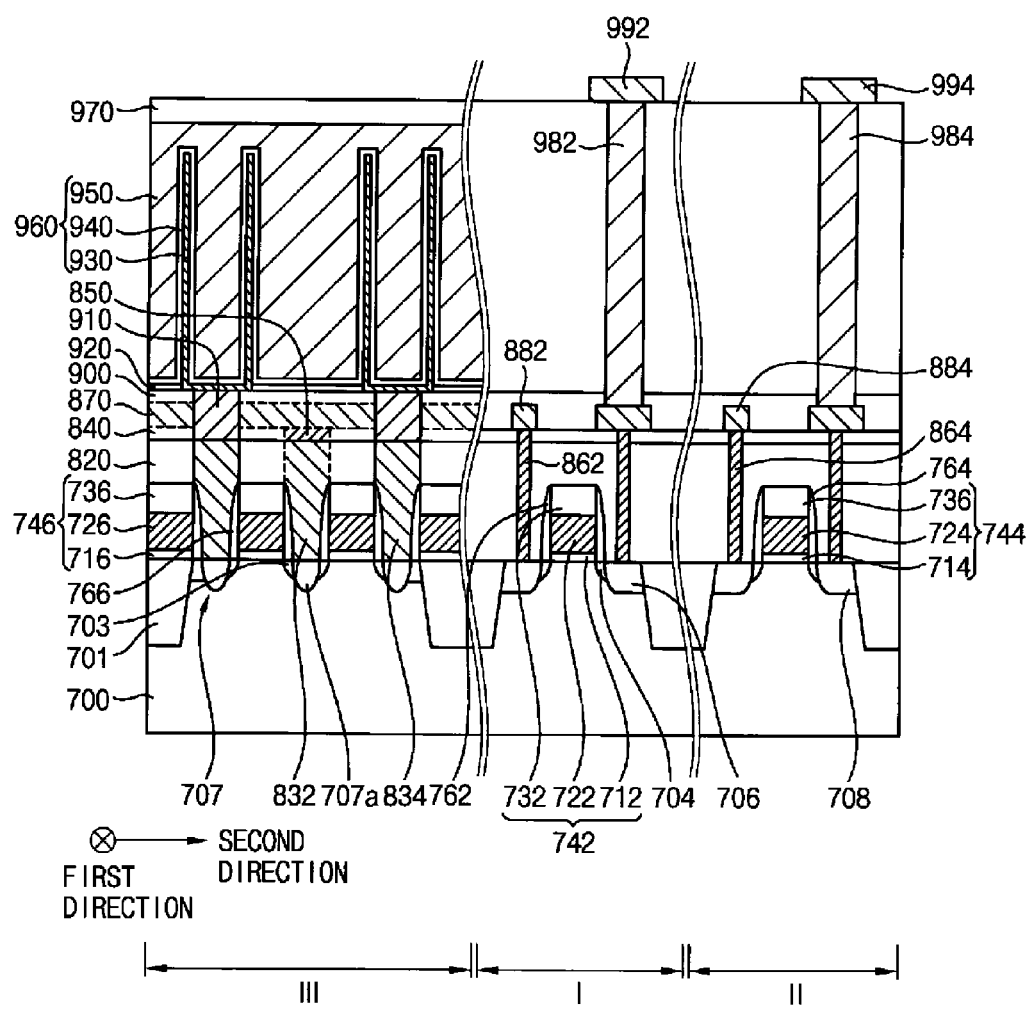

Referring to FIG. 37, third openings (not shown) are formed in the second and third insulating interlayers 840 and 900 to expose the second plugs 834. A fourth conductive layer is formed on the third insulating interlayer 900, including over the second plugs 834, to fill the fourth openings. The fourth conductive layer may be formed of doped polysilicon, a metal, a metal nitride and/or a metal silicide. Then the fourth conductive layer is planarized to such an extent that an upper surface of the third insulating interlayer 900 is exposed. As a result, the portions of the fourth conductive layer remaining in the third openings form capacitor contacts 910 electrically connected to the second plugs 834, respectively.

An etch stop layer 920 and a mold layer (not shown) are sequentially formed on the capacitor contacts 910 and the third insulating interlayer 900 in the third region III. In an example of this embodiment, the etch stop layer 920 is formed of silicon nitride, and the mold layer is formed of silicon oxide. Fourth openings (not shown) are formed in the mold layer and the etch stop layer 920 to expose the capacitor contacts 910, respectively. Then a fifth (conformal) conductive layer is formed on the mold layer. Thus, the fifth conductive layer extends along the sides of the fourth openings. The fifth conductive layer may be formed of doped polysilicon, a metal, a metal nitride and/or a metal silicide. A sacrificial layer (not shown) is formed on the fifth conductive layer to fill the remaining portion of the fourth openings. The sacrificial layer and the fifth conductive layer are planarized to such an extent that an upper surface of the mold layer is exposed. Then the sacrificial layer is removed. Each portion of the fifth conductive layer that remains in a fourth opening forms a lower electrode 930.

A dielectric layer 940 is formed on the lower electrode 930 and the etch stop layer 920. The dielectric layer 940 may be formed of silicon nitride or of a high-k material such as tantalum oxide, hafnium oxide, aluminum oxide, zirconium oxide, or the like.

An upper electrode 950 is then formed on the dielectric layer 940. The upper electrode 950 may be formed of doped polysilicon, a metal, a metal nitride and/or a metal silicide.

Each lower electrode 930, the dielectric layer 940 and the upper electrode 950 constitute a capacitor 960.

A fourth insulating interlayer 970 is then formed on the third insulating interlayer 900 including over the capacitors 960. Fifth openings (not shown) are formed in the fourth insulating interlayer 970 to expose the first and second wirings 882 and 884. A sixth conductive layer is formed on the fourth insulating interlayer 970 to fill the fifth openings. The sixth conductive layer may be formed of doped polysilicon, a metal, a metal nitride and/or a metal silicide. The sixth conductive layer is then planarized to such an extent that an upper surface of the fourth insulating interlayer 970 is exposed. The portions of the sixth conductive layer that remain in the fifth openings form fifth and sixth plugs 982 and 984 electrically connected to the first and second wirings 882 and 884, respectively.

Third and fourth wirings 992 and 994 electrically connected to the fifth and sixth plugs 982 and 984 are formed on the fourth insulating interlayer 970, and a protection layer (not shown) for protecting the third and fourth wirings 992 and 994 may be formed on the fourth insulating interlayer 970 to thereby complete the semiconductor device. The semiconductor device thus includes a CMOS transistor having excellent driving current characteristics.

According to the inventive concepts as described above, there is provided a method of fabricating a transistor in which a metal-oxide layer is used to induce tensile stress in the channel region of the transistor. Accordingly, electrons have a relatively high degree of mobility through the channel region. This translates into improved driving current characteristics and a higher operating speed for the transistor. Furthermore, the metal-oxide may be etch friendly. That is, the metal-oxide may be removed without damaging the underlying structure such as the gate electrode structure and/or substrate.

Semiconductor devices as described above in accordance with the inventive concepts may be employed in various types of semiconductor packages. Examples of the types of packages that may incorporate semiconductor devices according to the inventive concept include a Package on Package (PoP), Ball Grid Arrays (BGA), Chip Scale Packages (CSP), a Plastic Leaded Chip Carrier (PLCC), a Plastic Dual In-line Package (PDIP), a Die in Waffle Pack, a Die in Wafer Form, a Chip On Board (COB) package, a Ceramic Dual In-line Package (CERDIP), a Plastic Metric Quad Flat Pack (MQFP), a Thin Quad Flat Pack (TQFP), a Small Outline Integrated Circuit (SOIC), a Shrink Small Outline Package (SSOP), a Thin Small Outline Package (TSOP), a System In Package (SIP), a Multi-Chip Package (MCP), a Wafer-level Fabricated Package (WFP), and a Wafer-level Processed Stack Package (WSP).

In addition, semiconductor devices according to the inventive concepts can be packaged along with one or more other types of semiconductor devices which perform another function so as to constitute, for example, a controller, a memory device, and/or a hybrid device.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of forming a semiconductor device, comprising:
    forming a gate electrode structure on a substrate;
    implanting impurities into the substrate to create an amorphous region within the substrate beside and adjacent the gate electrode structure;
    forming a metal-oxide layer on the amorphous region and the gate electrode structure; and
    subsequently crystallizing the amorphous region by thermally treating the metal-oxide layer and the amorphous region, wherein compressive stress is consequently induced in the amorphous region.

2. The method of claim 1, wherein the metal-oxide layer is formed directly on the amorphous region of the substrate.

3. The method of claim 1, wherein the metal-oxide layer is the only layer on the amorphous region when the amorphous region is crystallized.

4. The method of claim 1, further comprising forming at least one other layer on the amorphous region and the gate electrode structure, and wherein the metal-oxide layer and at least one other material layer are on the amorphous region when the amorphous region is crystallized.

5. The method of claim 1, wherein the semiconductor device is an NMOS transistor.

6. The method of claim 1, wherein the metal-oxide layer is formed of a material selected from the group consisting of $Al_2O_3$, HfSiO, ZrSiO, LaSiO, HfSiON and ZrSiON.

7. The method of claim 2, wherein the thermal treatment is executed at a temperature lower than the crystallization temperature of the metal-oxide layer.

8. The method of claim 2, wherein the metal-oxide layer is a layer of $Al_2O_3$ and the thermal treatment is executed at a temperature range of 500° C. to 800° C.

9. The method of claim 1, further comprising removing the metal-oxide layer after the thermal treatment has been carried out.

10. The method of claim 9, wherein the metal-oxide layer is removed with a solution of HF.

11. The method of claim 1, further comprising forming a spacer on a sidewall of the gate electrode structure after the impurities have been implanted and before the metal-oxide layer has been formed.

12. The method of claim 11, further comprising removing the metal-oxide layer after the thermal treatment, and implanting second impurities in the substrate using the gate electrode structure and the spacer as a mask after the metal-oxide layer has been removed, to produce an LDD structure adjacent the gate electrode.

13. The method of claim 11, wherein the spacer is formed of SiN, and further comprising removing the metal-oxide layer with a solution of HF after the thermal treatment.

14. The method of claim 1, further comprising forming a spacer on the sidewall of the gate electrode, and wherein the impurities are implanted into the substrate to create the amorphous region after the spacer has been formed.

15. The method of claim 14, wherein the metal-oxide layer is formed directly on the substrate.

16. The method of claim 1, forming a layer of SiN on the metal-oxide layer before the thermal treatment.

17. The method of claim 1, wherein the forming of the gate electrode structure comprises forming a recess in the substrate, and forming the gate electrode within the recess.

18. The method of claim 1, further comprising forming an etch stop layer interposed between the substrate and the metal-oxide layer.

19. A method of forming a semiconductor device, comprising:
    forming a gate electrode structure on a substrate;
    implanting impurities into the substrate to create an amorphous region within the substrate adjacent a sidewall of the gate electrode structure; and
    subsequently inducing stress in a channel region of the substrate located below the gate electrode structure by forming a tensile stress overlay on the substrate, wherein the forming of the tensile stress overlay comprises forming a metal-oxide layer on the amorphous region.

20. The method of claim 19, wherein the forming of the tensile stress overlay comprises forming the metal-oxide layer directly on the amorphous region of the substrate.

21. The method of claim 19, wherein the metal-oxide layer is formed of material selected from the group consisting of $Al_2O_3$, HfSiO, ZrSiO, LaSiO, HfSiON and ZrSiON.

22. The method of claim 19, further comprising removing the tensile stress overlay after the stress has been induced in the channel region of the substrate, wherein the removing the tensile stress overlay comprises removing the metal-oxide layer with a solution of HF.

23. The method of claim 19, further comprising forming a spacer on the sidewall of the gate electrode structure after the impurities have been implanted and before the tensile stress overlay has been formed.

24. The method of claim 23, further comprising removing the tensile stress overlay after the stress has been induced in the channel region of the substrate, and implanting second impurities in the substrate using the gate electrode structure and the sidewall spacer as a mask after the tensile stress overlay has been removed, to thereby produce an LDD structure adjacent the gate electrode.

25. The method of claim 23, wherein the spacer is formed of SiN, and further comprising removing the metal-oxide layer with a solution of HF after the stress has been induced in the channel region of the substrate.

26. The method of claim 19, further comprising forming a spacer on the sidewall of the gate electrode structure, and wherein the impurities are implanted into the substrate to create the amorphous region after the spacer has been formed.

27. The method of claim 26, wherein the forming of the tensile stress overlay comprises forming the metal-oxide layer directly on the amorphous region of the substrate.

28. The method of claim 19, wherein the forming of the tensile stress overlay further comprises forming a layer of SiN on the metal-oxide layer.

29. The method of claim 19, wherein the forming of the gate electrode structure comprises forming a recess in the substrate, and forming a gate electrode of the gate electrode structure within the recess.

30. A method of forming a semiconductor device, comprising:
    forming a gate electrode structure of an NMOS transistor on a substrate, wherein the gate electrode structure includes a patterned insulation layer and a gate electrode disposed on the patterned insulation layer;
    implanting impurities into the substrate to create an amorphous region within the substrate beside and adjacent the gate electrode structure;
    forming source/drain regions of the NMOS transistor in the substrate at opposite sides of the first gate electrode structure; and
    inducing tensile stress in a region of the substrate, corresponding to a channel of the NMOS transistor, by forming a tensile stress overlay on the substrate, wherein the forming of the tensile stress overlay comprises forming a metal-oxide layer on the amorphous region and heating the metal-oxide layer by subjecting the substrate bearing the tensile stress overlay to a thermal treatment.

31. The method of claim 30, wherein the impurities are implanted into the substrate with an ion implantation energy of 2 KeV to 60 KeV.

32. The method of claim 30, wherein the NMOS transistor is formed at one region of the substrate constituting an NMOS region of the device, and wherein the gate electrode structure and the gate electrode are a first gate electrode structure and a first gate electrode, respectively, and further comprising:
    forming a PMOS transistor at another region of the substrate constituting a PMOS region of the device, wherein the forming of the PMOS transistor comprises forming a second gate electrode structure at said another region of the device, the second gate electrode structure including a second gate electrode disposed on the patterned insulation layer,
    forming source/drain regions of the PMOS transistor in the substrate at opposite sides of the second gate electrode structure, and
    inducing compressive stress in a region of the substrate, corresponding to the channel of the PMOS transistor, by creating tensile stress within a region of the substrate adjacent the second gate electrode.

33. The method of claim 32, wherein the forming of the NMOS and PMOS transistors comprises:
    forming a mask over the PMOS region of the device before the first impurities are implanted into the substrate, and
    removing the mask after the first impurities are implanted into the substrate, and
    forming the tensile stress layer over the NMOS and PMOS regions of the device before the thermal treatment is carried out, and
    removing the tensile stress overlay after the thermal treatment has been carried out, and
    wherein the compressive stress is induced in the region of the substrate, corresponding to the channel of the PMOS, after the tensile stress overlay has been removed.

34. The method of claim 33, wherein the inducing of compressive stress in a region of the substrate corresponding to the channel of the PMOS transistor comprises forming a trench adjacent the second electrode structure, and filling the trench with single-crystalline silicon-germanium (SiGe).

35. The method of claim 30, wherein the forming of the tensile stress overlay comprises forming the metal-oxide directly on the amorphous region of the substrate.

36. The method of claim 30, wherein the metal-oxide layer is of material selected from the group consisting of $Al_2O_3$, HfSiO, ZrSiO, LaSiO, HfSiON and ZrSiON.

37. The method of claim 30, wherein the thermal treatment is executed at a temperature lower than the crystallization temperature of the metal-oxide layer.

38. The method of claim 30, wherein the thermal treatment is executed at a temperature higher than the crystallization temperature of the metal-oxide layer.

39. The method of claim 30, wherein the metal-oxide layer is a layer of $Al_2O_3$ and the thermal treatment is executed at a temperature range of 500° C. to 800° C.

40. A method of forming a semiconductor device, comprising:
    forming a gate electrode structure on a substrate;
    implanting impurities into the substrate to create an amorphous region within the substrate beside and adjacent the gate electrode structure;
    forming a metal-oxide layer on the amorphous region and the gate electrode structure;
    forming at least one other layer on the amorphous region and the gate electrode structure; and
    subsequently crystallizing the amorphous region by thermally treating the metal-oxide layer and the amorphous region, wherein compressive stress is consequently induced in the amorphous region.

* * * * *